United States Patent
Malakapalli et al.

(10) Patent No.: US 6,467,060 B1
(45) Date of Patent: Oct. 15, 2002

(54) MASS STORAGE ERROR CORRECTION AND DETECTION SYSTEM, METHOD AND ARTICLE OF MANUFACTURE

(75) Inventors: Krishna Rameshwara Malakapalli, Burnsville, MN (US); Kinhing Paul Tsang, Plymouth, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/344,759

(22) Filed: Jun. 25, 1999

Related U.S. Application Data

(60) Provisional application No. 60/090,875, filed on Jun. 26, 1998.

(51) Int. Cl.[7] ................... G11B 20/18; H03M 13/29
(52) U.S. Cl. ................... 714/758; 714/769; 714/805
(58) Field of Search ................... 714/755, 758, 714/769, 805

(56) References Cited

U.S. PATENT DOCUMENTS

| | | | | |
|---|---|---|---|---|
| 4,380,029 A | * | 4/1983 | Bode | 360/48 |
| 5,285,456 A | * | 2/1994 | Cheney et al. | 371/49.1 |
| 5,629,949 A | * | 5/1997 | Zook | 371/37.1 |
| 5,805,799 A | * | 9/1998 | Fredrickson et al. | 395/185.05 |
| 5,812,755 A | * | 9/1998 | Kool et al. | 395/182.06 |
| 5,892,633 A | * | 4/1999 | Ayres et al. | 360/73.8 |
| 6,012,119 A | * | 1/2000 | Ninomaya et al. | 710/128 |
| 6,012,839 A | * | 1/2000 | Nguyen et al. | 371/37.4 |
| 6,052,815 A | * | 4/2000 | Zook | 714/758 |
| 6,092,231 A | * | 7/2000 | Sze | 714/758 |

\* cited by examiner

Primary Examiner—Stephen M. Baker
(74) Attorney, Agent, or Firm—Kirk A. Cesari; Derek J. Berger

(57) ABSTRACT

Data integrity is increased on mass-storage devices through a scheme whereby, a frame-based cyclic redundancy code (CRC) for each sector is recorded. A frame-based CRC is generated from the CRCs of the frames that compose a sector of data. In recording data, a CRC is generated from each frame, later, a master CRC is generated from the frame CRCs, then sector and master CRC are recorded on the mass-storage device medium. In retrieving data, the sector composed of frames and a master CRC are read, a plurality of CRCs are generated from each of the frames, a second master CRC is generated from the frame CRCs, and the master CRCs are compared to determine data integrity. In another embodiment, an input/output error detection and correction checksum (IOEDC), an error correction code (ECC) and a CRC are generated from a sector of data, and the IOEDC, ECC and CRC are stored on disc with the data sector.

16 Claims, 20 Drawing Sheets

MASS STORAGE ERROR CORRECTION AND DETECTION SYSTEM, METHOD AND ARTICLE OF MANUFACTURE

RELATED APPLICATION

This application claims the benefit of U.S. Provisional Application Ser. No. 60/090,875, filed Jun. 26, 1998 under 35 U.S.C. 119(e). This application is related to copending U.S. application Ser. No. 09/344,786, filed Jun. 25, 1999 also entitled "MASS STORAGE ERROR CORRECTION AND DETECTION SYSTEM, METHOD AND ARTICLE OF MANUFACTURE."

FIELD OF THE INVENTION

The present invention relates to the field of mass-storage devices. More particularly, this invention relates to data integrity and error detection and correction in a disc drive.

BACKGROUND OF THE INVENTION

One key component of any computer system is a device to store data. Computer systems have many different places where data can be stored. One common place for storing massive amounts of data in a computer system is on a disc drive. The most basic parts of a disc drive are a disc that is rotated, an actuator that moves a transducer to various locations over the disc, and electrical circuitry that is used to write and read data to and from the disc. The disc drive also includes circuitry for encoding data so that it can be successfully retrieved and written to the disc surface. A microprocessor controls most of the operations of the disc drive as well as passing the data back to the requesting computer and taking data from a requesting computer for storing to the disc.

Information representative of data is stored on the surface of the storage disc. Disc drive systems read and write information stored on tracks on storage discs. Transducers, in the form of read/write heads attached to the sliders, located on both sides of the storage disc, read and write information on the storage discs when the transducers are accurately positioned over one of the designated tracks on the surface of the storage disc. The transducer is also said to be moved to a target track. As the storage disc spins and the read/write head is accurately positioned above a target track, the read/write head can store data onto a track by writing information representative of data onto the storage disc. Similarly, reading data on a storage disc is accomplished by positioning the read/write head above a target track and reading the stored material on the storage disc. To write on or read from different tracks, the read/write head is moved radially across the tracks to a selected target track. The data is divided or grouped together on the tracks. In some disc drives, the tracks are a multiplicity of concentric circular tracks. In other disc drives, a continuous spiral is one track on one side of a disc drive. Servo feedback information is used to accurately locate the transducer. The actuator assembly is moved to the required position and held very accurately during a read or write operation using the servo information.

Conventional disc drives and other mass-storage devices provide a variety of error detection and correction (EDAC) schemes. In applications in which data integrity is of the utmost importance, such as medical diagnosis and treatment where data errors can have lethal effects on patients. Furthermore, increasing the efficiency of data storage on disc drives and other mass-storage devices is a perpetual interest for users of mass-storage devices in order to decrease the cost of storage. Prior art products fail to solve all of the problems with the integrity and efficiency of data stored on disc or other mass-storage. Therefore, what is needed is a disc or mass-storage drive with improved data integrity and efficiency of the stored data on the disc or other mass-storage medium.

The present invention provides a solution to this and other problems, and offers the additional advantage of increasing the efficiency of physical data storage over the prior art.

SUMMARY OF THE INVENTION

The present invention relates to disc drives or other mass-storage devices that have a novel scheme of error detection and correction which solve the above-mentioned problem of insufficient data integrity for fault-intolerant applications.

In accordance with one embodiment of the invention, a method is provided in which a Cyclic Redundancy Code (CRC) is calculated from each frame of a sector of data. Subsequently, for each sector, a master sector CRC is calculated from each of the frame CRCs. The use of a master CRC calculated from each of the frame CRCs in the sector is referred to as a "frame-based CRC." Subsequently, the Error Correction Code (ECC) of the sector data is calculated. Finally the sector data, master CRC and the ECC are recorded on disc. In accordance with another embodiment of the invention, a method is provided in which a sector of data and a first master CRC is received wherein the master CRC is determined by determining one CRC from each of a plurality of frames of the sector and determining the master CRC from the plurality of frame CRCs and the integrity of the sector and the master CRC is verified. In accordance with another embodiment of the invention, an information handling system is provided which includes a sender, a receiver connected to the sender, and means for receiving from the sender a plurality of data frames and an equal number of CRCs associated with each of the frames and generating a master CRC from the frame CRCs. In accordance with another embodiment of the invention, a mass-storage drive is provided that includes an input port, a mass-storage device connected to the drive, and means for receiving through the input port a plurality of data frames and an equal number of CRCs associated with each of the frames and generating a master CRC from the frame CRCs, discarding the frame CRCs, and transmitting to the mass-storage device the plurality of data frames and the master CRC. In accordance with another embodiment of the invention, a mass-storage drive is provided that includes an input port, a mass-storage device connected to the drive, and means for receiving from the mass-storage device, a sector of data and a first master CRC wherein the master CRC is determined by determining one CRC from each of a plurality of portions of the sector.

The present invention also can be implemented as a computer-readable program storage device which tangibly embodies a program of instructions executable by a computer system to perform the present mass-storage device error detection and correction method.

In accordance with one embodiment of the invention, a method of generating error detection and correction information for data is provided in which at least one data sector is received and an Input/Output Error Detection and Correction checksum (IOEDC), a Cyclic Redundancy Code (CRC) and an ECC is generated from the at least one sector.

The integrity of most types of data transfers is enhanced by frame-based CRCs. More specifically, table 1 below summarizes the four basic types of data transfers that management means or controller for a mass-storage medium will support.

TABLE 1

|  | Evenly Divisible by Sector Size | Not Divisible Evenly by Sector Size |
|---|---|---|
| User Data | 1 | 2 |
| Non-User Data | 3 | 4 |

User data is generated as a result of direct user action, such as a user entering and saving text using a word processing file. Non-user data is generated by the computer system for lower-level system support, such as disc-cached data. In table 1, type 1 data transfers involve guaranteed sector data transfers that are written or read exclusively by the host. E.g. data transfers to support mass-storage device read and write commands. In table 1, type 2 data transfers are not guaranteed to be either sectored or non-sectored and which are written or read by the host and/or controller firmware. E.g. Windows® random access memory (RAM) by the controller firmware to modify the data before the data is transferred to the host computer. In table 1, type 3 data transfers are guaranteed sector data transfers that are written or read exclusively by the firmware, but in which the sector size as the data is to be written or the mass-storage device as the sector size selected by the user application program that originated the write request. In table 1, type 4 data transfers are word-mode data transfers initiated by the ECC correction logic when an error in read data has been detected. Frame-based CRCs improve the integrity of types 1, 2 and 4 data stored on the mass-storage, but do not improve the integrity of data type 3.

Advantageously, the invention increases the integrity of data stored on mass-storage, which is achieved through the use of a master CRC that is calculated from each of the frame CRCs. The use of a master CRC yields much greater data integrity than previous methods of error detection and correction.

Advantageously, the invention reduces format overhead on mass-storage device which is achieved through the use of a master CRC. The use of a master CRC yields such a great increase in data integrity that the use of the IOEDC for error detection and correction may be obsolete. IOEDC for error detection and correction is not recorded on disc, contrary to conventional systems, resulting in reduced format overhead and therefore increased efficiency in the use of storage space on the medium.

Advantageously, the invention reduces controller logic complexity. This is achieved by the present invention because IOEDC logic does not need to be implemented on the controller or the portion of the system that manages the mass-storage.

Advantageously, impact on controller design is minimized. The present invention leverages the use of conventional controller logic because conventional controller chips are typically manufactured with logic that will generate a CRC from data. The present invention uses the existing error detection and correction logic for generating CRCs, therefore, no additional logic to support CRC processing is required. Therefore, the use of existing EDAC logic minimizes changes in controller logic to implement the invention.

Advantageously, data integrity is improved by recording a host of error correction data on disc along with the data sector. This is achieved by recording IOEDC, CRC, and ECC data from the sector, along with the sector.

These and various other features as well as advantages which characterize the present invention will be apparent upon reading of the following detailed description and review of the associated drawings.

DETAILED DESCRIPTION

In the following detailed description of the preferred embodiment, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
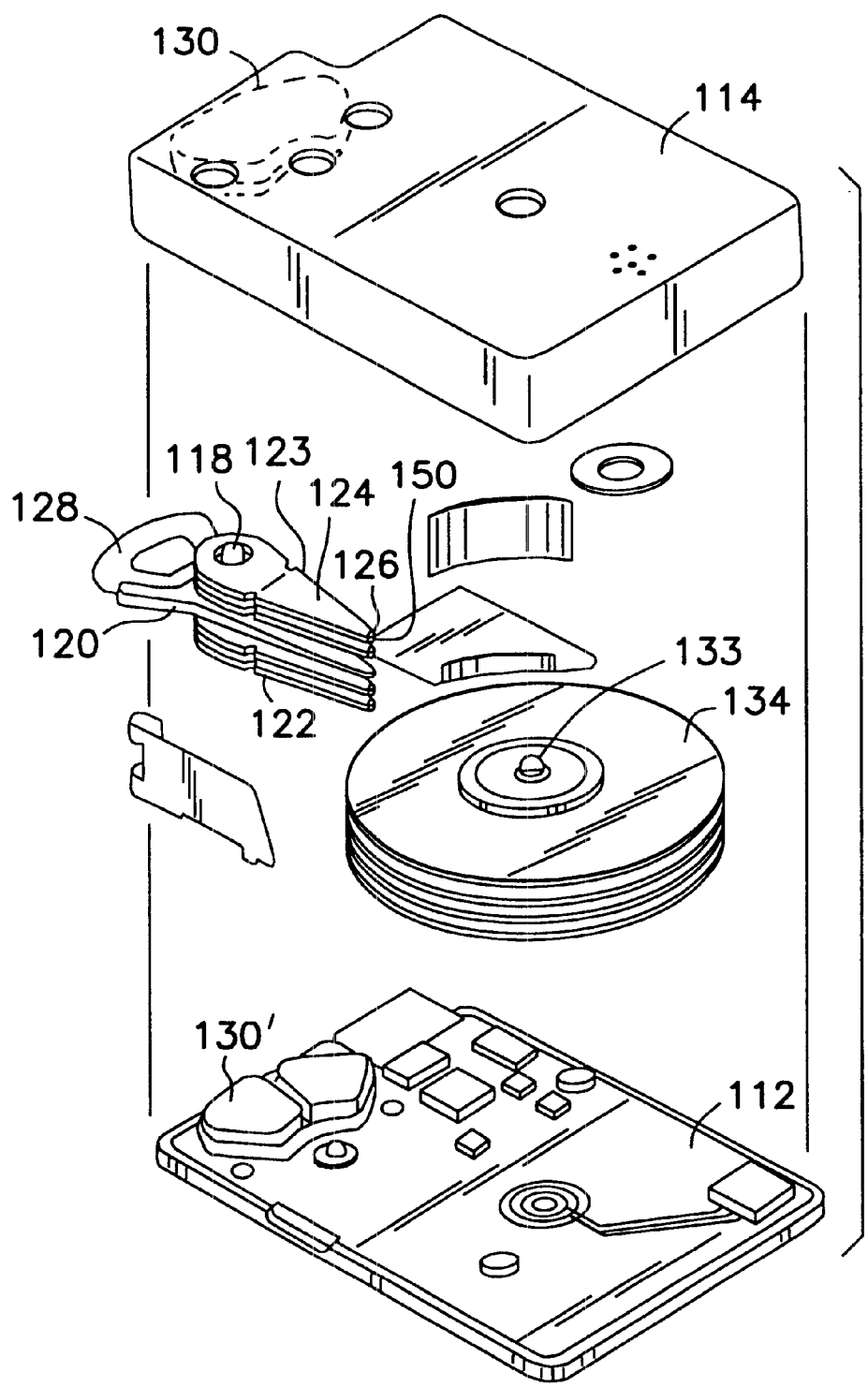
FIG. 1 is an exploded view of a disc drive with a multiple disc stack and a ramp assembly for loading and unloading transducers to and from the surfaces of the discs.

Referring now the FIG. 1, the invention described in this application is useful with all mechanical configurations of disc drives having either rotary or linear actuation. In addition, the invention is also useful in all types of disc drives including hard disc drives, zip drives, floppy disc drives and any other type of drives where unloading the transducer from a surface and parking the transducer may be desirable. FIG. 1 is an exploded view of one type of a disc drive 100 having a rotary actuator. The disc drive 100 includes a housing or base 112, and a cover 114. The base 112 and cover 114 form a disc enclosure. Rotatably attached to the base 112 on an actuator shaft 118 is an actuator assembly 120. The actuator assembly 120 includes a comb-like structure 122 having a plurality of arms 123. Attached to the separate arms 123 on the comb 122, are load beams or load springs 124. Load beams or load springs are also referred to as suspensions. Attached at the end of each load spring 124 is a slider 126 which carries a magnetic transducer 150. The slider 126 with the transducer 150 form what is many times called the head. It should be noted that many sliders have one transducer 150 and that is what is shown in the figures. It should also be noted that this invention is equally applicable to sliders having more than one transducer, such as what is referred to as an MR or magneto resistive head in which one transducer 150 is generally used for reading and another is generally used for writing. On the end of the actuator arm assembly 120 opposite the load springs 124 and the sliders 126 is a voice coil 128.

Attached within the base 112 is a first magnet 130 and a second magnet 130'. As shown in FIG. 1, the second magnet 130' is associated with the cover 114. The first and second magnets 130, 130', and the voice coil 128 are the key components of a voice coil motor which applies a force to the actuator assembly 120 to rotate it about the actuator shaft 118. Also mounted to the base 112 is a spindle motor. The spindle motor includes a rotating portion called the spindle hub 133. In this particular disc drive, the spindle motor is within the hub. In FIG. 1, a number of discs 134 are attached to the spindle hub 133. In other disc drives a single disc or a different number of discs may be attached to the hub. The invention described herein is equally applicable to disc drives which have a plurality of discs as well as disc drives that have a single disc. The invention described herein is also equally applicable to disc drives with spindle motors which are within the hub 133 or under the hub.

Figure 2:
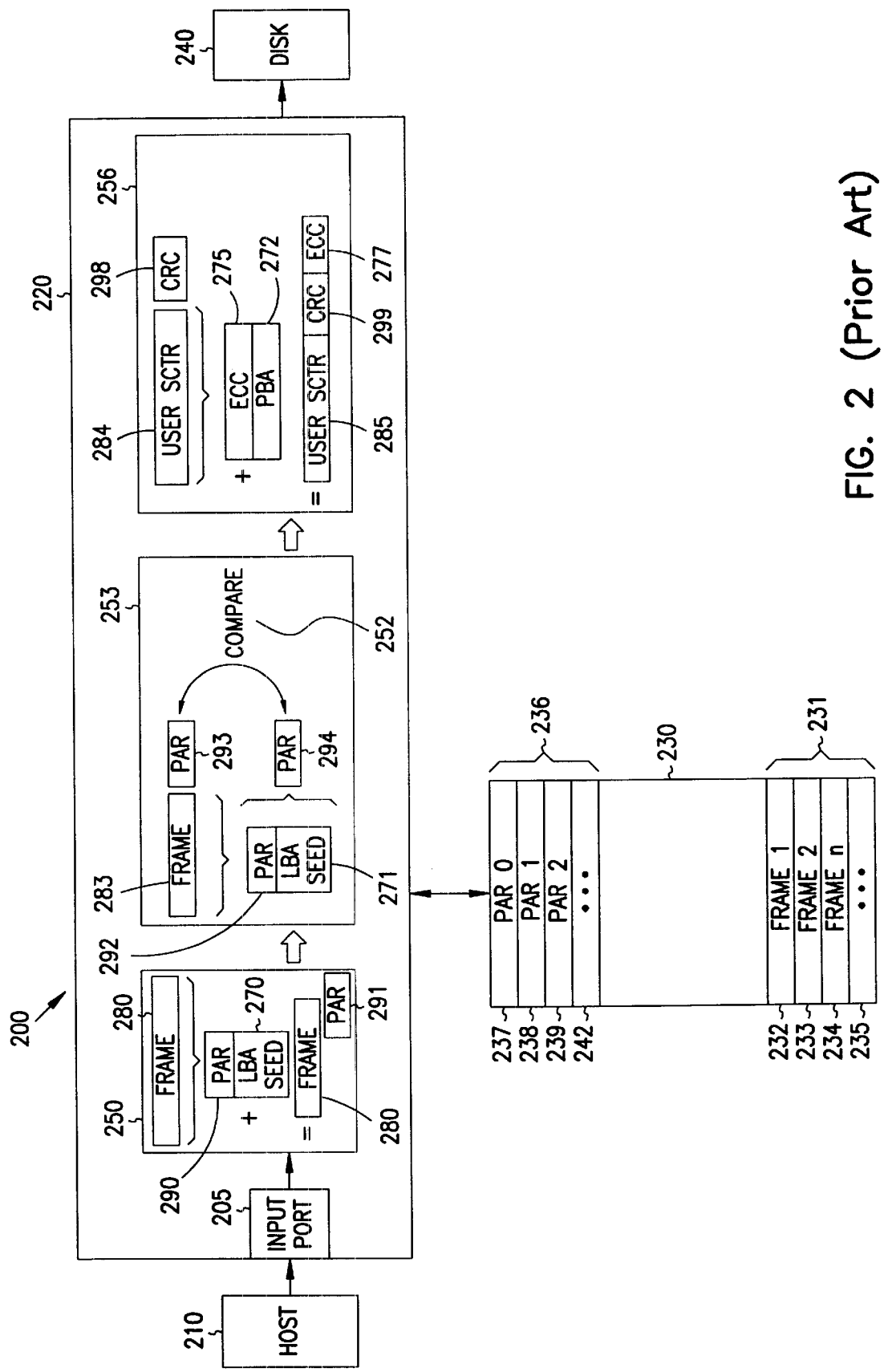
FIG. 2 is a block diagram of a conventional prior art system associated with the data written to a disc.

Referring now to FIG. 2, a conventional prior art computer system 200 is shown. FIG. 2 illustrates several steps in recording of data onto the disc. A system 200, like the one shown in FIG. 2 includes an input port 205, a host 210, a disc drive controller 220, dynamic random access memory (DRAM) 230, a disc 240. In one embodiment, the disc is magnetic, in another embodiment, the disc is optical. In another embodiment, the disc is a magnetic tape drive. In another embodiment, the disc is an optical tape drive. In yet another embodiment, the disc is a memory device.

Under the direction of a write request, host 210 transmits data in frames or chunks 280 to the disc controller 220. Each frame 280 is a subset of a 512-byte sector. Each frame 280 is 64 bytes in length. Eight frames comprise one sector. Block 250 illustrates the controller 220 process in which a frame 280 and the logical buffer address (LBA) 270 of the frame 280 is received from the host 210 through the input port 205. Thereafter, a parity 290 is calculated from the frame 280. The parity 290 is calculated in a conventional manner well-known in the prior art. The parity 290 is 32 bytes in length; 4 bytes for each frame, there being 8 frames in each sector.

Subsequently, the frame 281 and parity 291 are stored in the DRAM buffer 230 in order to accommodate the differing transmission rates of the sending host 210 and the receiving disc 240. Frame 281 is stored in a first portion of the memory 231 in any one of locations 232, 233, 234, 235 according to memory allocation techniques that are well-known to one skilled in the art. Parity 291 is stored in a second portion 236 of the memory 230 in any one of locations 237, 238, 239, 242 according to memory allocation techniques that are well-known to one skilled in the art.

The DRAM 230 is addressed as "buffer frames," each frame consisting of 16 DRAM words and one parity word. The parity word is computed as a bit-wise XOR of the data words, so that like bit positions in the data words and parity word make up independent parity codewords. The size of the parity word is 32 bits or 4 bytes for every 16 DRAM words. Each DRAM word is 32 bits or 4 bytes. Thus, four bytes of parity for every 64 bytes of data in the DRAM 230. For 512 bytes of data, 32 bytes is needed to represent the parity as depicted below in table 2:

TABLE 2

| | | | | | | | | | | | | | |
|---|---|---|---|---|---|---|---|---|---|---|---|---|---|
| Parity Word: | $P_{31}$ | $P_{30}$ | $P_{29}$ | $P_{28}$ | $P_{27}$ | $P_{26}$ | ... | $P_5$ | $P_4$ | $P_3$ | $P_2$ | $P_1$ | $P_0$ |
| Data Word 15: | $D_{31}$ | $D_{30}$ | $D_{29}$ | $D_{28}$ | $D_{27}$ | $D_{26}$ | ... | $D_5$ | $D_4$ | $D_3$ | $D_2$ | $D_1$ | $D_0$ |
| Data Word 14: | $D_{31}$ | $D_{30}$ | $D_{29}$ | $D_{28}$ | $D_{27}$ | $D_{26}$ | ... | $D_5$ | $D_4$ | $D_3$ | $D_2$ | $D_1$ | $D_0$ |
| ⋮ | ⋮ | ⋮ | ⋮ | ⋮ | ⋮ | ⋮ | | ⋮ | ⋮ | ⋮ | ⋮ | ⋮ | ⋮ |
| Data Word 3: | $D_{31}$ | $D_{30}$ | $D_{29}$ | $D_{28}$ | $D_{27}$ | $D_{26}$ | ... | $D_5$ | $D_4$ | $D_3$ | $D_2$ | $D_1$ | $D_0$ |
| Data Word 2: | $D_{31}$ | $D_{30}$ | $D_{29}$ | $D_{28}$ | $D_{27}$ | $D_{26}$ | ... | $D_5$ | $D_4$ | $D_3$ | $D_2$ | $D_1$ | $D_0$ |
| Data Word 1: | $D_{31}$ | $D_{30}$ | $D_{29}$ | $D_{28}$ | $D_{27}$ | $D_{26}$ | ... | $D_5$ | $D_4$ | $D_3$ | $D_2$ | $D_1$ | $D_0$ |
| Data Word 0: | $D_{31}$ | $D_{30}$ | $D_{29}$ | $D_{28}$ | $D_{27}$ | $D_{26}$ | ... | $D_5$ | $D_4$ | $D_3$ | $D_2$ | $D_1$ | $D_0$ |
| LBA: | $L_{31}$ | $L_{30}$ | $L_{29}$ | $L_{28}$ | $L_{27}$ | $L_{26}$ | ... | $L_5$ | $L_4$ | $L_3$ | $L_2$ | $L_1$ | $L_0$ |

(One Parity Codeword)

Thereafter, frame 283 is retrieved from a first portion of the memory 231 and parity 293 is retrieved from a second portion 232 of the memory 230, as illustrated in block 253. Thereafter, the parity 294 is recalculated by calculating a parity 292 of the frame 283, while seeding the parity 292 with the LBA 271. Parity 294 is compared 254 for equality with the retrieved parity 293 that is associated with the retrieved frame 283 in order to ensure data integrity. If the recalculated parity 294 is not equal to the retrieved parity 293 that is associated with the frame 283, indicating an error in either the frame 283 or the associated parity 293, then the frame 283 and the associated parity 293 are discarded and retrieved again from the DRAM Buffer 230.

Preparation for writing to the disc occurs in block 256, in which all of the frames for a particular sector are assembled into a sector 284. Subsequently, a 5-byte CRC 298 is calculated from the sector 284, the CRC being seeded with the physical buffer address (PBA) 272 of the sector. Different embodiments will use a CRC with a different number of bytes depending upon the error detection requirements as is well-known to one skilled in the art. All CRCs are calculated using division either using shifts and exclusive ORs or table lookup (such as modulo 256 or 65536 ). A CRC is "redundant" in that it adds no information. A single corrupted bit in the data will result in a one bit change in the calculated CRC but multiple corrupted bits may cancel each other out. CRCs treat blocks of input bits as coefficient-sets for polynomials. E. g., binary 10100000 implies the polynomial: 1*x^7+0*x^6+1*x^5+0*x^4+0*x^3+0*x^2+0*x^1+0*x^0. This is the "message polynomial". A second polynomial, with constant coefficients, is called the "generator polynomial". This is divided into the message polynomial, giving a quotient and remainder. The coefficients of the remainder form the bits of the final CRC. Therefore, an order-33 generator polynomial is necessary to generate a 32-bit CRC. Of course, the exact bit-set used for the generator polynomial will naturally affect the CRC that is computed.

Thereafter, an error-correction code (ECC) 275 from the sector 284 is calculated, the ECC being seeded with the physical buffer address (PBA) 272 of the sector. PBA 272 is calculated by the arithmetic logic unit (ALU) (not shown) of the controller from the LBA that is received in the write request The ECC 275 is 30 bytes in length. Subsequently, the sector 285, the PBA-seeded CRC 299, and the PBA-seeded ECC 277 are transmitted to the disc 240 which records the sector 285, CRC 299, and ECC 277 to the mass storage physical medium. When recorded, the 512 bytes of data has an additional 5 bytes of CRC data and 30 bytes of ECC data in the format overhead for a total of 547 bytes of storage by each 512-byte sector of data.

Figure 3:
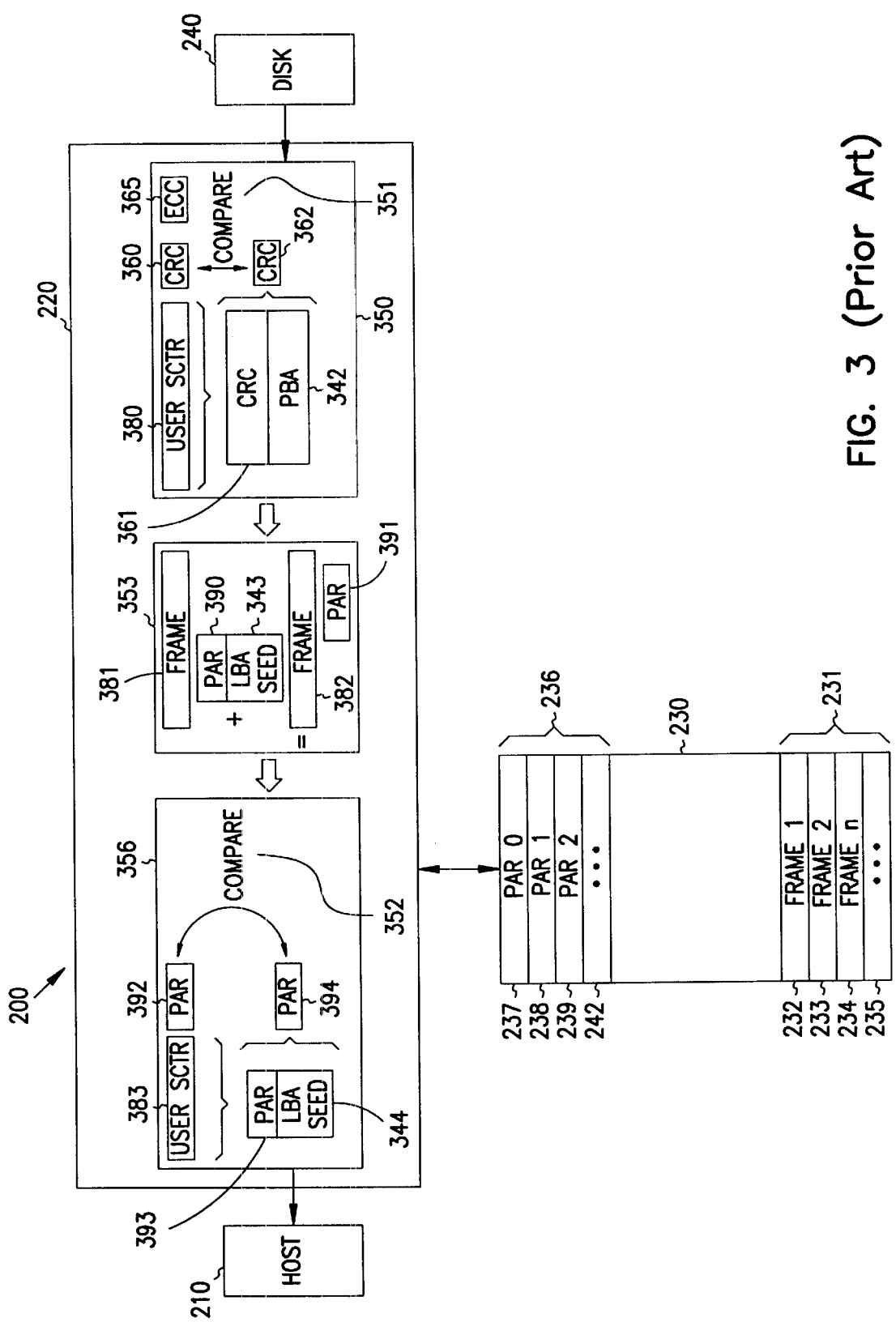
FIG. 3 is a block diagram of a conventional prior art system associated with the data read from a disc.

Referring now to FIG. 3, a conventional prior art computer system is illustrated in FIG. 3. FIG. 3 illustrates several steps in reading data from the disc. A system 300, like the one shown in FIG. 3 includes a host 210, a disc drive controller 220, dynamic random access memory (DRAM) 230, and a disc 240.

Under the direction of a read request, disc 240 reads the 512-byte sector of data 380, the associated CRC 360, ECC 365, and logical block address (LBA) 342. The CRC 360 is 5 bytes in length. The ECC 365 is 30 bytes in length. In block 350, the CRC 361 for the 512-byte sector 380 is recalculated while seeding the CRC 362 with LBA 342 to arrive at LBA-seeded CRC 362. CRC 362 is compared 351 for equality to the associated CRC 360. If the recalculated CRC 362 is not equal to the CRC 360 that is associated with the 512-byte sector 380, indicating an error in either the 512-byte sector 380 or the associated CRC 360, an attempt is made in using the ECC 365 to correct the error, after which the CRC 361 for the 512-byte sector 380 is recalculated again while seeding the CRC 362 with LBA 342 to arrive at LBA-seeded CRC 362 and CRC 362 is again compared 351 for equality to the associated CRC 360. If the second comparison of CRCs indicates inequality, then 512-byte sector of data 380, CRC 360, and ECC 365 are discarded and retrieved again from the disc 340.

If the recalculated CRC 362 is equal to the CRC 360 that is associated with the 512-byte sector 380, indicating no error in either the 512-byte sector 380 or the associated CRC 360, then in block 353, the 512-byte sector of data 380 is transmitted in 64-byte frames 381, and a parity 390 is calculated, seeded with the LBA 342 of the sector.

Subsequently, the frame 382 and parity 391 are stored in the DRAM buffer 230 in order to accommodate the differing transmission rates of the sending host 210 and the receiving disc 240. Frame 382 is stored in a first portion of the memory 231 in any one of locations 232, 233, 234, 235 according to memory allocation techniques that are well-known to one skilled in the art. Parity 391 is stored in a second portion 236 of the memory 230 in any one of locations 237, 238, 239, 242 according to memory allocation techniques that are well-known to one skilled in the art.

Subsequently, in block 356, the 64-byte frame 383 and the associated seeded parity 392 is retrieved from the DRAM buffer 230, and the seeded parity 393 is calculated from the retrieved sector data 383. Parity 393 is seeded with LBA 344 to calculate LBA-seeded parity 394. Calculated LBA-seeded parity is compared for equality with the retrieved LBA-seeded parity 392 that is associated with the 64-byte frame 383 in order to ensure data integrity. If the recalculated LBA-seeded parity 394 is not equal to the seeded parity 392 that is associated with the 64-byte frame 383, indicating an error in either the 64-byte frame 383 or the associated LBA-seeded parity 392, then the 64-byte frame 383 and the associated LBA-seeded parity 392 is discarded and retrieved again from the DRAM Buffer 230. If the recalculated parity 394 is equal to the LBA-seeded parity 392 that is associated with the 64-byte frame Ad 383, indicating no error in either the 64-byte frame 383 or the associated LBA-seeded parity 392, then the 64-byte frame 383 and the associated seeded parity 392 are transmitted to the host 210.

Figure 4:
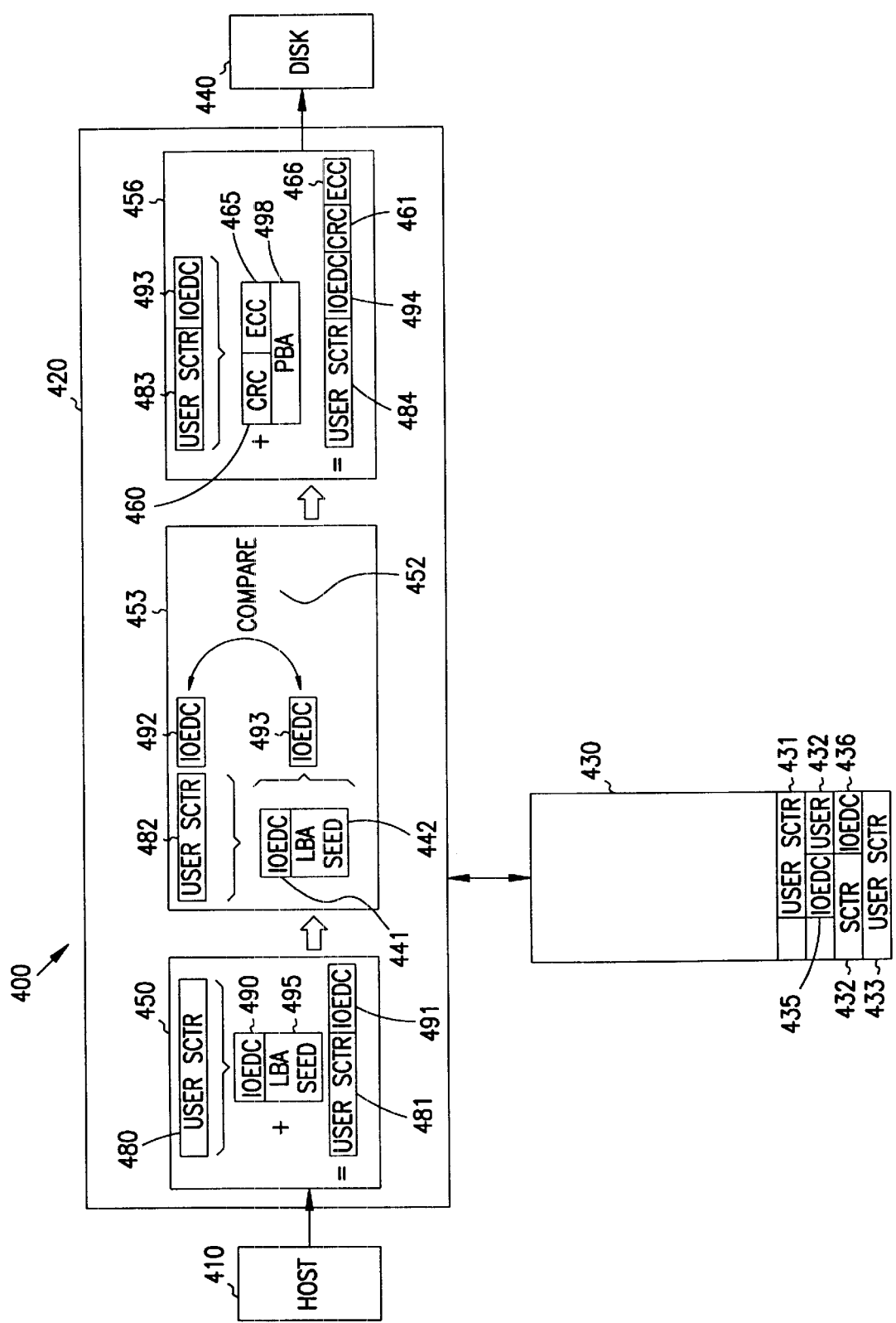
FIG. 4 is a block diagram of a preferred embodiment system using IOEDC data associated with the data written to a disc.

The present invention using IOEDC is illustrated in FIG. 4. The inventive computer system 400 is shown. A system 400, like the one shown in FIG. 4, includes a host 410, a disc drive controller 420, dynamic random access memory (DRAM) 430, and a disc 440. FIG. 4 illustrates several steps in the recording of data onto the disc. In one embodiment, the disc is magnetic, in another embodiment, the disc is optical. In another embodiment, the disc is a magnetic tape drive. In another embodiment, the disc is an optical tape drive. In yet another embodiment, the disc is a memory device.

Under the direction of a write command, host 410 transmits data in bytes that are aggregated into 512-byte sector sized buffers 480 in the disc controller 420. The write request includes a logical buffer address (LBA) 495 of 512-byte sector 480. Block 450 illustrates the controller 420 process in which an IOEDC 490 is calculated from the 512-byte sector 480. The IOEDC 490 is a checksum, which is calculated by summing the values of each byte of the 512-byte sector 480. The IOEDC 490 is 2 bytes in length. The calculation is seeded with the logical buffer address (LBA) 495.

Subsequently, data is stored in a DRAM buffer 430.

In data transfers of types 1 and 3, the 512-byte sector 481 and its associated IOEDC 491 are sequentially stored in the DRAM buffer 430 as 431, 432, 433 for the 512-byte sector 481 and 435, 436 for the IOEDC 491 in order to accommodate the differing transmission rates of the sending host 410 and the receiving disc 440.

In data transfers of types 2 and 4, the storing in DRAM is conventional. A parity (not shown) is generated from each of the frames in the sector. The 512-byte sector 481 and the parities are sequentially stored in the DRAM buffer 430 as 431, 432, 433 for the 512-byte sector in order to accommodate the differing transmission rates of the sending host 410 and the receiving disc 440.

Subsequently, the data is retrieved from the DRAM buffer 430.

In data transfers of types 1 and 3, as shown in block 453, the 512-byte sector 482 is retrieved from the DRAM buffer 430, and the IOEDC 493 is recalculated and compared 452 for equality with the IOEDC 492 that is associated with the 512-byte sector 482 in order to ensure data integrity. IOEDC 493 is recalculated by first generating an IOEDC 493 from the sector 441 seeded with the LBA 442. If the recalculated IOEDC 493 is not equal to the IOEDC 492 that is associated with the 512-byte sector 482, an error exists in either the 512-byte sector 482 or the associated IOEDC 492. In the event of an error, the 512-byte sector 482 and the associated IOEDC 492 is discarded and retrieved again from the DRAM Buffer 430.

In data transfers of types 2 and 4, retrieval is conventional, in which, the 512-byte sector 482 is retrieved from the DRAM buffer 430, the parities (not shown) are retrieved, the parities are recalculated with the LBA seed, and compared for equality with the retrieved parities associated with the 512-byte sector 482 in order to ensure data integrity. If the recalculated parities (not shown) are not equal to the retrieved parities that is associated with the 512-byte sector 482, an error exists in either the 512-byte sector 482 or the retrieved parities, in which event, the 512-byte sector 482 and the associated parities are discarded and retrieved again from the DRAM Buffer 430.

Preparation for writing to the disc occurs in block 456, in which a CRC 460 of the 512-byte sector 483 and the associated IOEDC 493 is calculated, an error correcting code (ECC) 465 of the 512-byte sector 483 and the associated IOEDC 493 is calculated, and the physical buffer address (PBA) 498 is determined. The CRC 460 is 5 bytes in length. The ECC 465 is 30 bytes in length.

CRC 460 is more complicated than a checksum. It is calculated using division either using shifts and exclusive ORs or table lookup (such as modulo 256 or 65536). The CRC 460 is "redundant" in that it adds no information. A single corrupted bit in the data will result in a one bit change in the calculated CRC 460 but multiple corrupted bits may cancel each other out. CRCs treat blocks of input bits as coefficient-sets for polynomials. E.g., binary 10100000 implies the polynomial: $1*x^7+0*x^6+1*x^5+0*x^4+0*x^3+0*x^2+0*x^1+0*x^0$. This is the "message polynomial". A second polynomial, with constant coefficients, is called the "generator polynomial". This is divided into the message polynomial, giving a quotient and remainder. The coefficients of the remainder form the bits of the final CRC. Therefore, an order-33 generator polynomial is necessary to generate a 32-bit CRC. Of course, the exact bit-set used for the generator polynomial will naturally affect the CRC that is computed.

Thereafter, the 512-byte sector 484, the associated IOEDC 494, CRC 461, and ECC 466 are transmitted to the disc 440 which records the 512-byte sector 484, the associated IOEDC 494, CRC 461, and ECC 466 to the physical medium. When recorded, the 512 bytes of data has appended 2 bytes of IOEDC data, 5 bytes of CRC data and 30 bytes of ECC data. Thus, the total storage requirements for one sector of 512 bytes of data is 549 bytes including the error correction overhead of IOEDC, CRC and ECC data.

Figure 5:
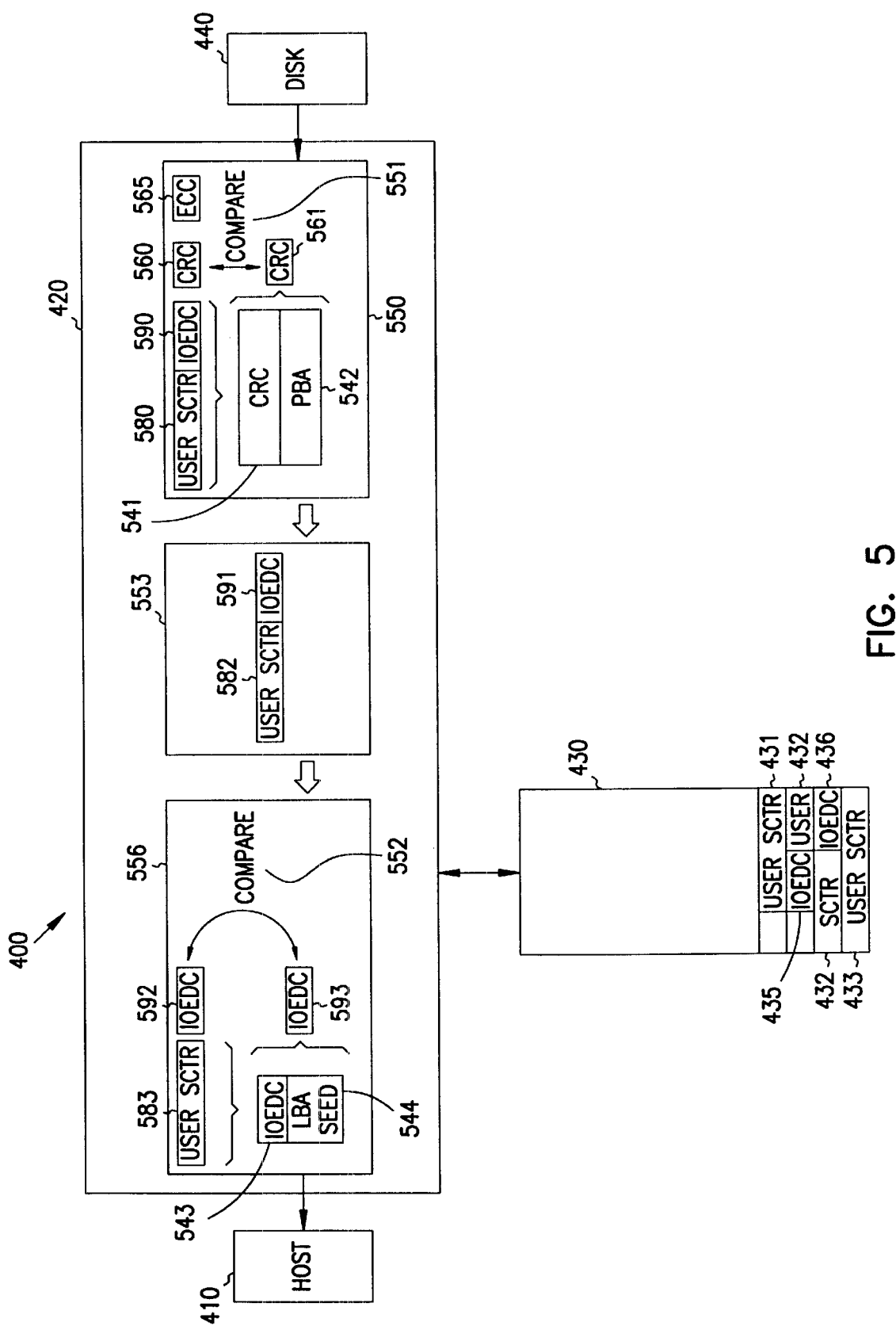
FIG. 5 is a block diagram of a preferred embodiment system using IOEDC data associated with the data read from a disc.

The present invention using IOEDC is illustrated in FIG. 5. The inventive computer system 400 is shown. A system 400, like the one shown in FIG. 5 includes a host 410, a disc drive controller 420, dynamic random access memory (DRAM) 430, and a disc 440. FIG. 5 illustrates several steps in reading of data from the disc. In one embodiment, the disc is magnetic, in another embodiment, the disc is optical. In another embodiment, the disc is a magnetic tape drive. In another embodiment, the disc is an optical tape drive. In yet another embodiment, the disc is a memory device.

Disc 540 reads the 512-byte sector of data 580, the associated IOEDC 590, CRC 560, and ECC 565. The IOEDC 590 is 2 bytes in length. The CRC 560 is 5 bytes in length. The ECC 565 is 30 bytes in length. In block 550, the CRC 561 for the 512-byte sector 580 is recalculated and compared 551 for equality to the associated CRC 560. CRC 561 is generated from CRC 541 and physical block address (PBA) 542 and CRC 541 is generated from data 580. If the recalculated CRC 561 is not equal to the CRC 560 that is associated with the 512-byte sector 580, indicating an error in either the 512-byte sector 580 or the associated CRC 560, then the 512-byte sector of data 580, the associated IOEDC 590, CRC 560, and ECC 565 is discarded and retrieved again from the disc 440. If the recalculated CRC 561 is equal to the CRC 560 that is associated with the 512-byte sector 580, indicating no error either the 512-byte sector 580 or the associated CRC 560, then in block 553, the 512-byte sector of data 582 and the associated IOEDC 591, are sequentially stored in the DRAM buffer 430 as 431, 432, 433 for the 512-byte sector 582 and 435, 436 for the IOEDC 591 in order to accommodate the differing transmission rates of the sending host 410 and the receiving disc 440.

Subsequently, in block 556, the 512-byte sector 583 is retrieved from the DRAM buffer 430, and the IOEDC 593 is recalculated and compared 552 for equality with the IOEDC 592 that is associated with the 512-byte sector 580 in order to ensure data integrity. IOEDC 593 is recalculated by first generating an IOEDC 543 from the data 583, then generating an LBA 544 from the data 583, and lastly generating an IOEDC 593 from the IOEDC 543 and the LBA 544. If the recalculated IOEDC 593 is not equal to the IOEDC 592 that is associated with the 512-byte sector 583, indicating an error in either the 512-byte sector 583 or the associated IOEDC 592, then the 512-byte sector 583 and the associated IOEDC 592 is discarded and retrieved again from the DRAM Buffer 430. If the recalculated IOEDC 593 is equal to the IOEDC 592 that is associated with the 512-byte sector 583, indicating no error in either the 512-byte sector 583 or the associated IOEDC 592, then the 512-byte sector 583 and the associated IOEDC 592 is transmitted to the host 410.

Figure 6:
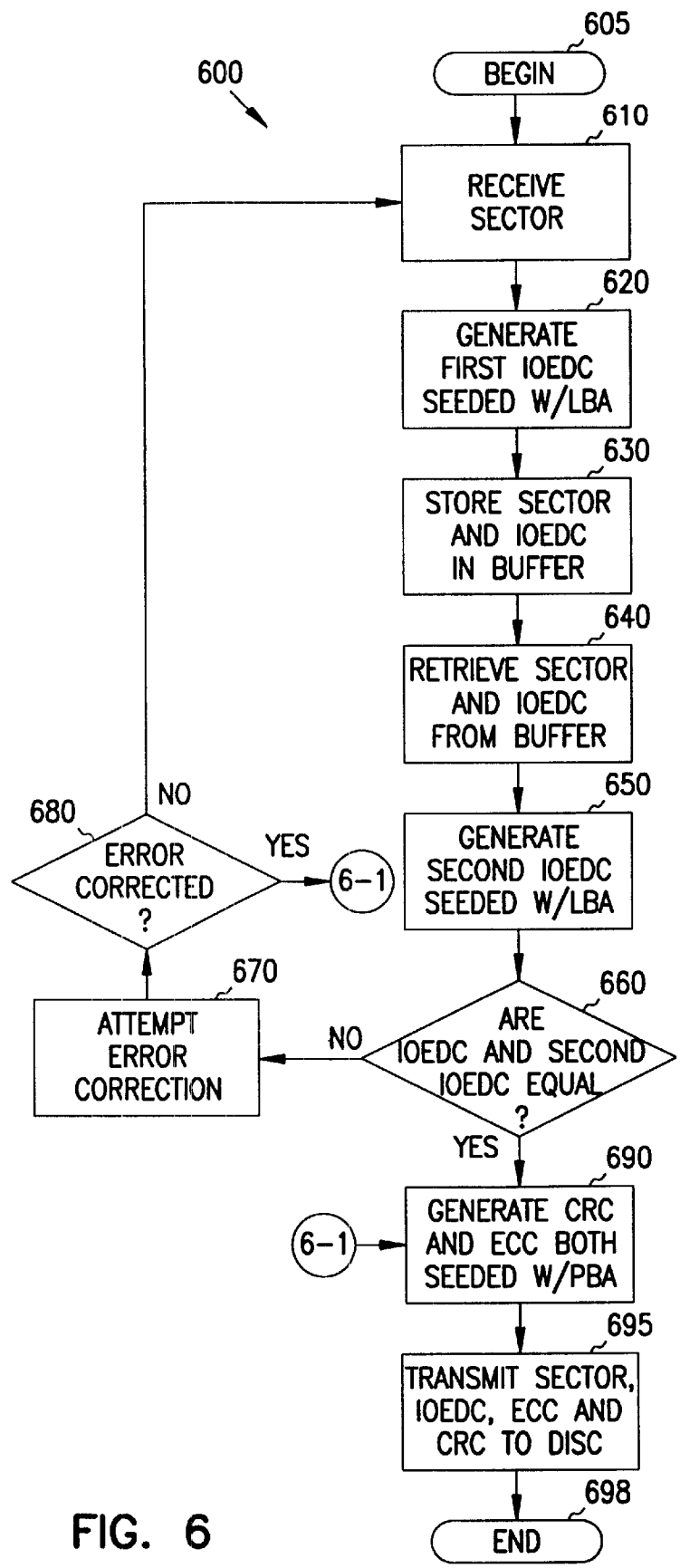
FIG. 6 is a block diagram of a preferred embodiment IOEDC method of recording data to a destination medium.

FIG. 6 is method 600 of one embodiment of the present IOEDC invention. Method 600 for generating error detection and correction information for data starts 605 and thereafter, receives from a sender a 512-byte sector of data 610. The write request that is associated with the sector indicates the LBA of the sector. Subsequently, a first IOEDC seeded with the LBA is generated 620. The sector and first IOEDC are sequentially stored in a buffer 630 in order to facilitate the different data rates of the sender and the destination disc. Thereafter, the sector and the IOEDC is retrieved from the buffer 640 and a second IOEDC seeded with the LBA is generated 650 to verify integrity of the sector and IOEDC retrieved in block 640. The first IOEDC is compared to the second IOEDC 660. If the comparison does not indicate equality, the entire procedure is restarted from the beginning with the re-receipt of the sector.

Continuing, a CRC and ECC both seeded with PBA, are generated 690 and the sector, IOEDC, ECC and CRC are transmitted to the destination disc for recording 695. Finally, the method ends 698.

Figure 7:
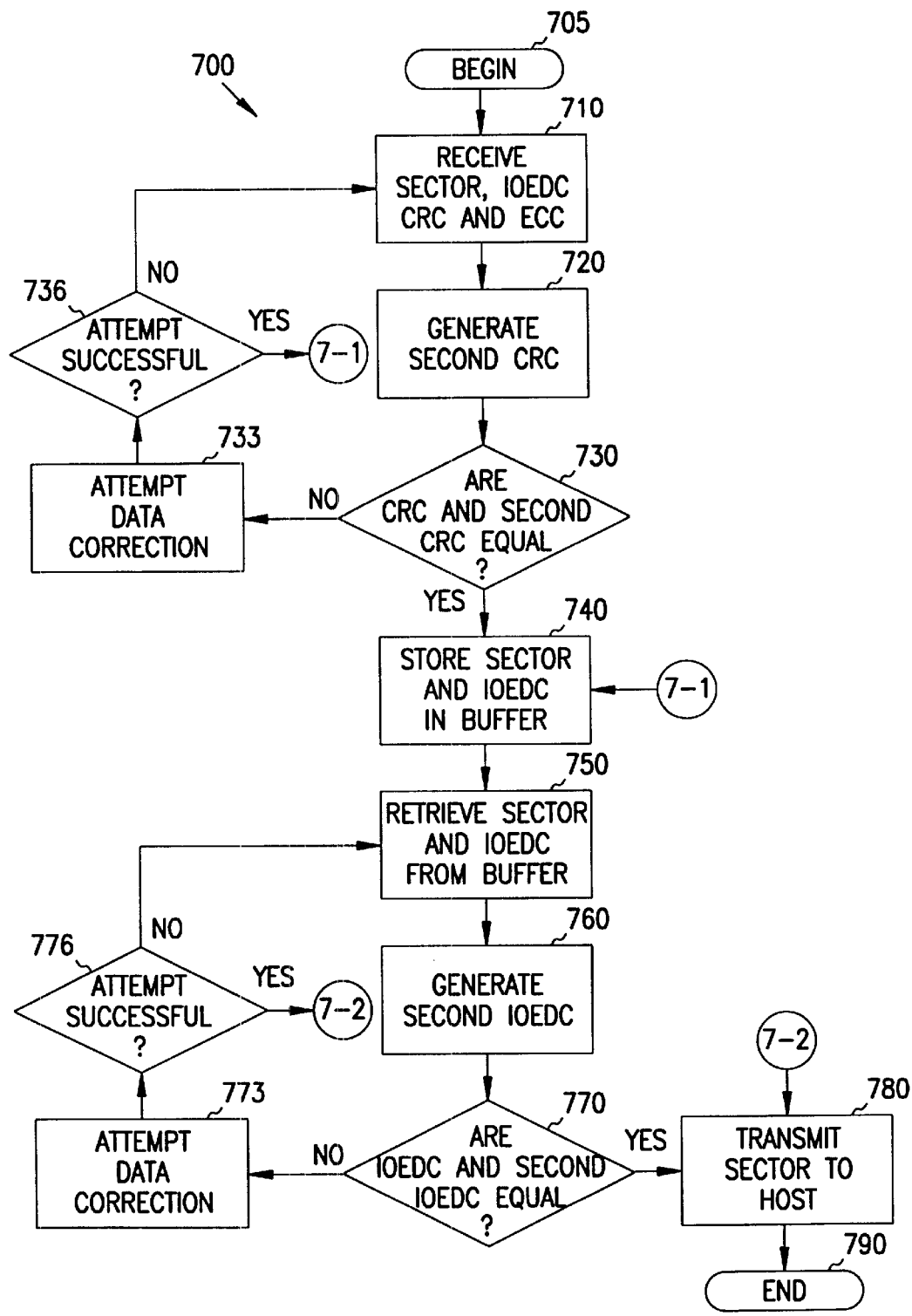
FIG. 7 is a block diagram of a preferred embodiment IOEDC method of reading data from a destination medium.

FIG. 7 is method 700 of one embodiment of the present IOEDC invention. Method 700 for generating error detection and correction information for data starts at 705 and thereafter, under command of a read request, a 512-byte sector of data, and IOEDC, a CRC and an ECC is received 710. Subsequently, a second CRC seeded with the PBA from the read request is generated from the sector of data 720 and the second CRC and original CRC are compared for equality to verify data integrity 730. If the comparison indicates equality, processing continues, however, if the comparison does not indicate equality, then an attempt in correcting the error using the ECC is made 733 and if the attempt is successful, processing continues at 7-1, however, if the attempt is unsuccessful, then the entire method is restarted with a repeated receipt of the sector, IOEDC, CRC and ECC from the disc 710. Continuing, the sector and IOEDC are sequentially stored in a buffer in transfer types 1 and 3, and the sector and parities generated from each of the frames of the sector are stored in a buffer, to facilitate the different communication speed of the sending disc and the receiving host 740. Subsequently, the sector and the IOEDC or parities, according to the transfer type, are retrieved from the buffer 750.

For transfer types 1 and 3, a second IOEDC is generated from the sector 760 and the second IOEDC and the IOEDC are compared for equality to test for data integrity 770. If the comparison does not indicate equality, the sector and IOEDC are re-retrieved from the buffer 750. Continuing, the sector is transmitted to the host 780 and the process ends 790.

For transfer types 2 and 4, a LBA-seeded parities for each frame are generated from the sector 760 and the generated parities are compared for equality to the retrieved parities to test for data integrity 770. If the comparison does not indicate equality, the sector and parities are re-retrieved from the buffer 750. Continuing, the sector is transmitted to the host 780 and the process ends 790.

Figure 8:
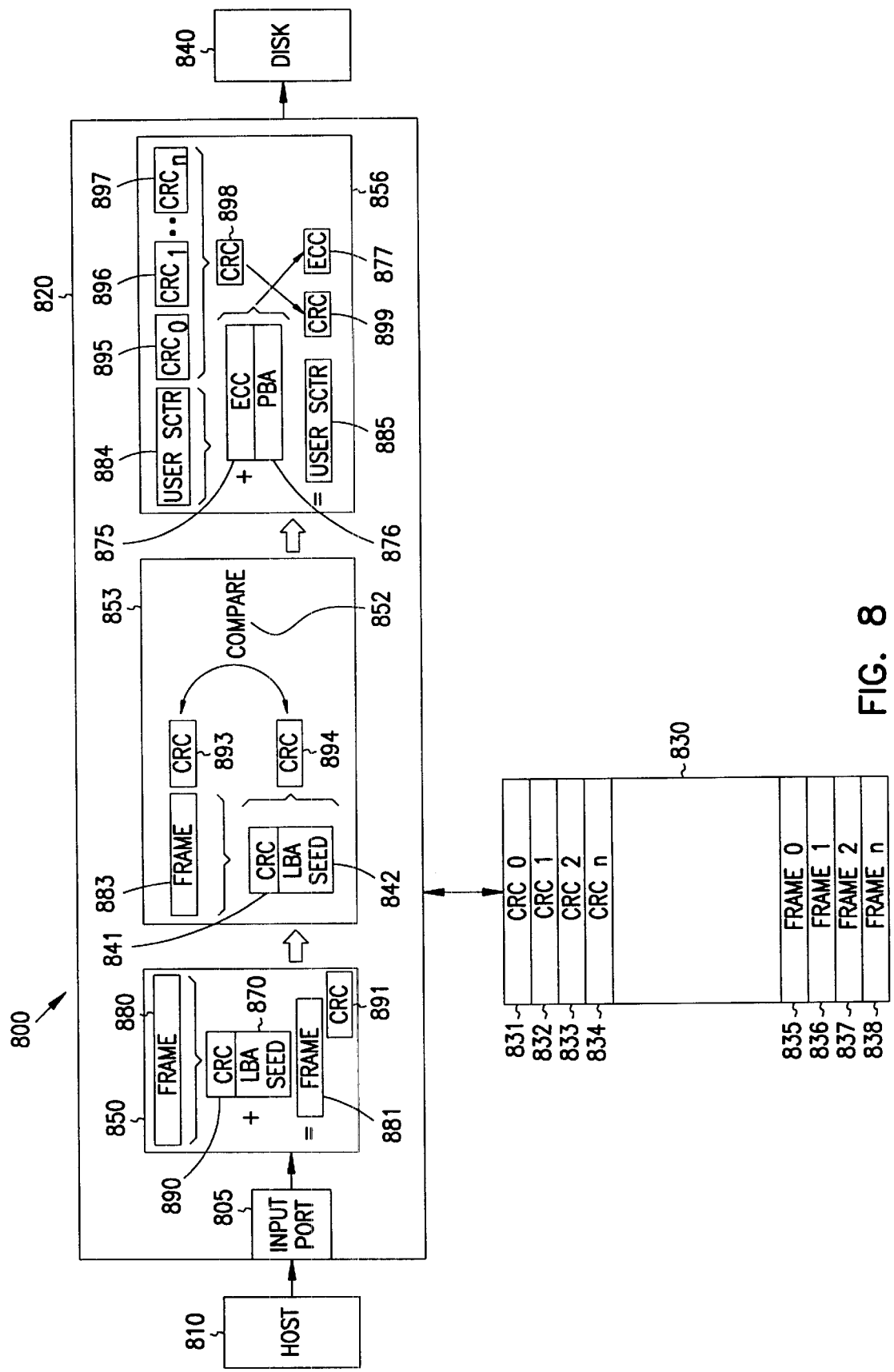
FIG. 8 is a block diagram of a preferred embodiment system of generating a master CRC in the writing of data to a disc.

The present invention using frame-based CRCs is illustrated in FIG. 8. FIG. 8 illustrates several steps in recording of data onto the disc. The inventive computer system 800 is shown. A system 800, like the one shown in FIG. 8 includes an input port 805, a host 810, a disc drive controller 820, dynamic random access memory (DRAM) 830, a disc 840. In one embodiment, the disc is magnetic, in another embodiment, the disc is optical. In another embodiment, the disc is a magnetic tape drive. In another embodiment, the disc is an optical tape drive. In yet another embodiment, the disc is a memory device.

Host 810 transmits data in frames or chunks 880 to the disc controller 820. Each frame 880 is a subset of a 512-byte sector. Each frame 880 is 64 bytes in length. 8 frames comprise one sector. Block 850 illustrates the controller 820 process in which a frame 880 is received from the host 810 in a write request, through the input port 805.

Thereafter, in data transfer types 1 and 3, a CRC 890 is calculated from the frame 880 and the logical buffer address (LBA) seed 870 is also determined from the write request for the frame 880. The CRC 890 is calculated in a conventional manner well-known in the prior art. The CRC 890 is 5 bytes in length. Subsequently, a LBA 870 seeded CRC 891 is calculated from CRC 890. Later, the frame 881 and CRC 891 are sequentially stored in the DRAM buffer 830 as 831, 832, 833 and 834 and frame 881 and 835, 836, 837, and 838 for the CRC 891 in order to accommodate the differing transmission rates of the sending host 810 and the receiving disc 840. For each 512-byte sector of data that is stored in DRAM 830, eight 64-byte frames are stored. Furthermore, each frame CRC is 5 bytes long, requiring 40 bytes to store the eight 5-byte CRCs.

Thereafter, in data transfer types 2 and 4, a conventional process in which, a parity (not shown) is generated for the frame, and the frame and the parities are stored in the DRAM (not shown), is performed, Subsequently, in data transfer of types 1 and 3, the frame 883 and the associated CRC 893 are retrieved from the DRAM buffer 830 as illustrated in block 853, and the CRC 894 is recalculated and compared 852 for equality with the retrieved CRC 893 that is associated with the retrieved frame 883 in order to ensure data integrity. CRC 894 is generated by generating a LBA 842 seeded CRC 841 from the frame 883. If the recalculated CRC 894 is not equal to the retrieved CRC 893 that is associated with the frame 883, indicating an error in either the frame 883 or the associated CRC 893, then the frame 883 and the associated CRC 893 are discarded and retrieved again from the DRAM Buffer 830. Otherwise, processing continues.

In data transfer of types 2 and 4, the parity and the frame are retrieved from disk, the parity is recalculated, seeded with the LBA, from the frame, and the recalculated parity is compared to the retrieved parities (not shown). If the comparison indicates inequality, the frame and the parity are re-retrieved, otherwise processing continues.

Preparation for writing to the disc occurs in block 856, in which all of the frames for a particular sector are assembled into a sector 884 and the associated CRCs 895, 896, 897 are likewise assembled. Subsequently, a 5-byte master CRC 898 is calculated using all of the frame CRCs 895, 896, 897. More specifically, the master CRC 898 is calculated using the data from the 5-byte frame CRCs 895, 896, 897 as if the 5-byte frame CRCs 895, 896, 897 were data. This is also referred to as a "frame-based" CRC. The use of a master CRC 898 calculated from each of the frame CRCs 895, 896, 897 is a more reliable and robust means for enabling error detection and correction as it allows for more variations of data corruption than can be detected and corrected. This is a critical feature of the invention.

Thereafter, an error LBA seeded error correcting code (ECC) 875 of the sector 884 is calculated. The ECC 875 is 30 bytes in length. Thereafter, an ECC 877 is calculated from the ECC 875 and the LBA 876. Subsequently, the sector 885, the master CRC 899, and the ECC 877 are transmitted to the disc 840 which records the sector 885, master CRC 899, and ECC 877 to the mass-storage physical medium. When recorded, the 512 bytes of data has an additional 5 bytes of CRC data and 30 bytes of ECC data in the format overhead for a total of 547 bytes.

Notably, the IOEDC is not calculated by the controller 820 or recorded on the disc 840 as in the inventive system illustrated in FIGS. 4 and 5. Thus, the total storage requirements for one sector of 5 bytes of data 885 is reduced by the number of bytes in an IOEDC for a total of 547 bytes including the error correction overhead of master CRC 899 and ECC data 877 are used. This is 2 bytes less than the system using IOEDC that needs 549 bytes to store a 512-byte sector of data as illustrated in FIGS. 4 and 5. This increases storage efficiency approximately 0.36%. Data integrity is also greatly increased.

Figure 9:
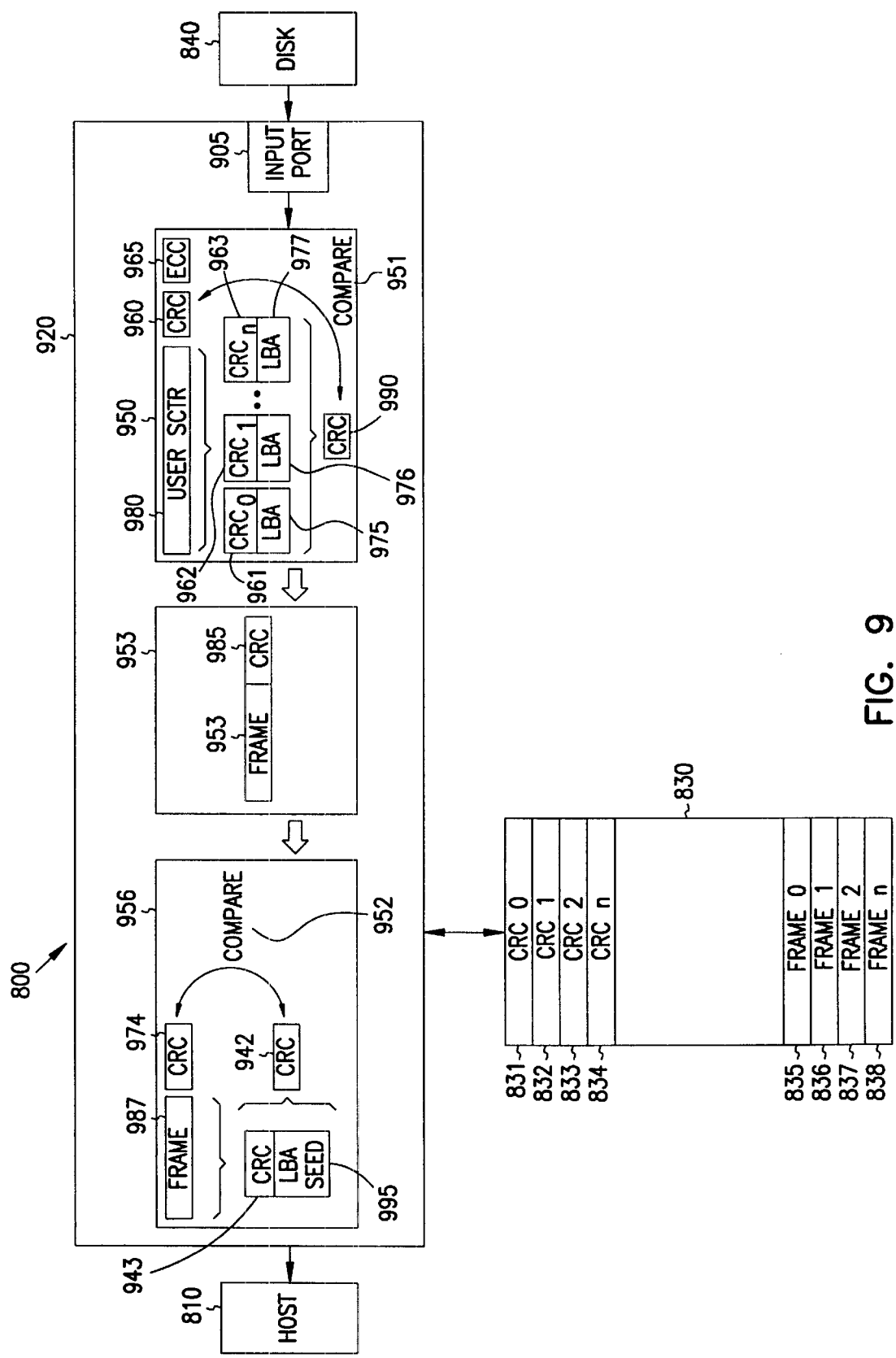
FIG. 9 is a block diagram of a preferred embodiment system of verifying integrity based on a master CRC in the reading of data from a disc.

The present invention using frame-based CRC is illustrated in FIG. 9. FIG. 9 illustrates several steps in reading data from the disc. The inventive computer system 800 is shown. A system 900, like the one shown in FIG. 9 includes a host 810, a disc drive controller 820, dynamic random access memory (DRAM) 830, a disc 840 and an input port 805. In one embodiment, the disc is magnetic, in another embodiment, the disc is optical. In another embodiment, the disc is a magnetic tape drive. In another embodiment, the disc is an optical tape drive. In yet another embodiment, the disc is a memory device.

Disc 840 reads the 512-byte sector of data 980, the associated master CRC 960, and ECC 965. The CRC 960 is 5 bytes in length. The ECC 965 is 30 bytes in length. The controller 920 receives 512-byte sector of data 980, the associated master CRC 960, and ECC 965 through the input port 905. Thereafter, in block 950, the sector 980 is logically or physically divided into chunks or frames and a CRC 961, 962, and 963 and a buffer address (LBA) 975, 976, 977 is obtained from the read request that prompted the process. Thereafter, the master CRC 990 for the 512-byte sector 980 is recalculated from the frame CRCs 961, 962, and 963 and the frame LBAs 975, 976, 977. The master CRC 990 is compared 951 for equality to the associated master CRC 960. If the recalculated master CRC 990 is not equal to the master CRC 960 that is associated with the 512-byte sector 980, indicating an error in either the 512-byte sector 980 or the associated CRC 960, then the ECC 965 is used to attempt correction of the error, after which the master CRC 990 is recalculated again and compared again to the retrieved master CRC 960, and if the second comparison does not indicate equality, the 512-byte sector of data 980, the associated master CRC 960, and the ECC 965 is discarded and retrieved again from the disc 840. If the recalculated master CRC 990 is equal to the master CRC 960 that is associated with the 512-byte sector 980, indicating no error in either the 512-byte sector 980 or the associated master CRC 960, then processing continues with block 953.

In data transfer types 1 and 3, in block 953, each of the chunks or frames of data 985 and the associated master CRC 964, are sequentially stored in the DRAM buffer 830 as 831, 832, 833, and 834 for frame 953 and 835, 836, 837, and 838 for CRC 985 in order to accommodate the differing transmission rates of the receiving host 810 and the sending disc 840. For each 512-byte sector of data that is stored in DRAM 830, eight 64-byte frames are stored. Furthermore, each frame CRC is 5 bytes long, requiring 40 bytes to store the eight 5-byte CRCs.

In data transfer types 2 and 4, a LBA-seeded parity (not shown) is calculated for each frame, and the parity and the frame is stored in DRAM 830.

Subsequently, the data is retrieved.

In data transfer types 1 and 3, in block 956, each chunk or frame 986 and the associated CRC 974 is retrieved from the DRAM buffer 830, and the CRC 942 is recalculated from the frame 986 and compared 952 for equality with the CRC 974 that is associated with the chunk or frame 987 in order to ensure data integrity. CRC 942 is recalculated by first generating a CRC 943 from the data 987, then generating a LBA seed 995 from the data 987, and lastly generating a LBA 995 seeded CRC 942. If the recalculated CRC 942 is not equal to the CRC 974 that is associated with the frame or buffer 987, indicating an error in either the chunk or frame 987 or the associated CRC 974, then the chunk or frame 987 and the associated CRC 974 is discarded and retrieved again from the DRAM Buffer 830. Alternatively, if the recalculated CRC 942 is equal to the CRC 974 that is associated with the chunk or frame 987, indicating no error in either the chunk or frame 987 or the associated CRC 974, and then the chunk or frame 987 and the associated CRC 974 is transmitted to the host 810.

In data transfer types 2 and 4, in block 956, each chunk or frame 986 and the associated parity (not shown) is retrieved from the DRAM buffer 830, and the LBA-seeded parity is recalculated from the frame 986 and compared for equality with the parity that is associated with the chunk or frame 987 in order to ensure data integrity. If the recalculated parity is not equal to the parity that is associated with the frame or buffer 987, indicating an error in either the chunk or frame 987 or the associated parity, then the chunk or frame 987 and the associated parity is discarded and retrieved again from the DRAM Buffer 830. Alternatively, if the recalculated parity is equal to the parity that is associated with the chunk or frame 987, indicating no error in either the chunk or frame 987 or the associated parity, and then the chunk or frame 987 and the associated parity is transmitted to the host 810.

Figure 10:
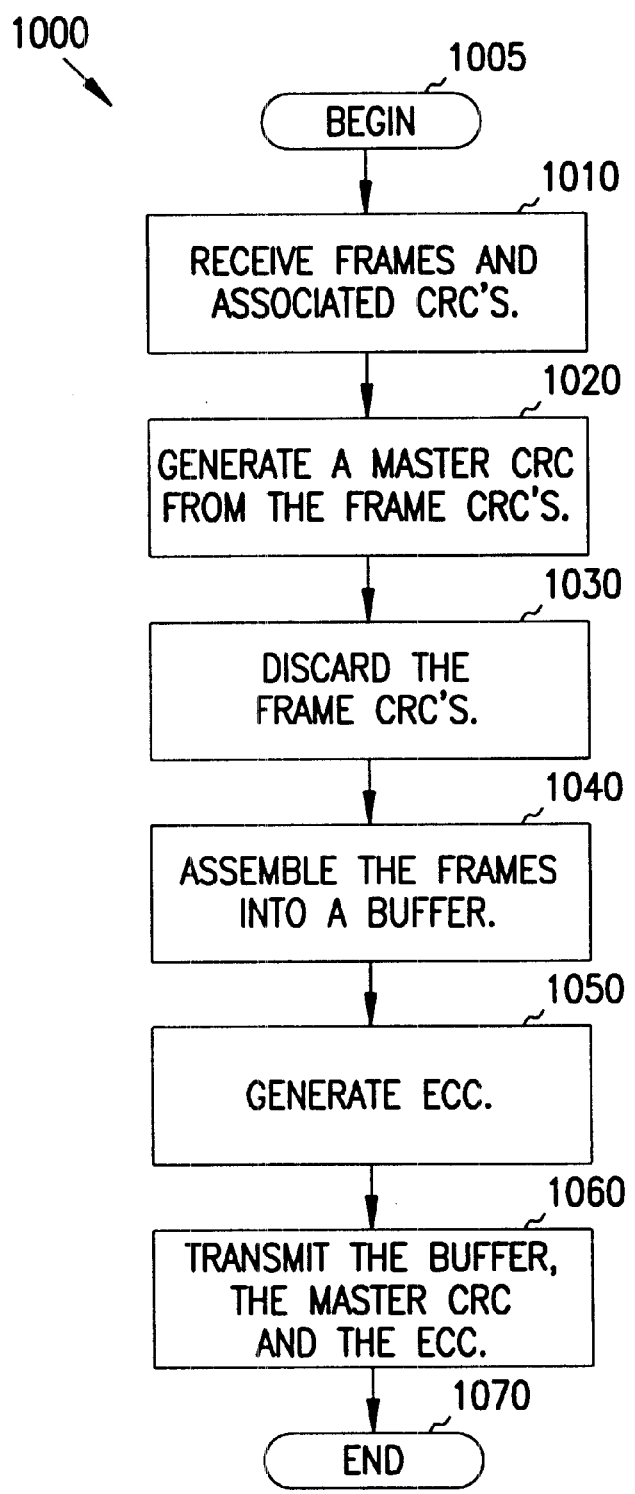
FIG. 10 is a block diagram of a preferred embodiment method of generating a master CRC in the writing of data to a disc.

FIG. 10 is flowchart 1000 of one embodiment of the present invention. The method starts 1005, and thereafter, a plurality of data frames and an equal number of CRCs associated with each of the frames is received from a sender 1010. During receipt of the frames and CRCs, the frames and associated CRCs may be temporarily buffered.

Buffering may involve verification of the integrity of the received frame and the associated CRC. Verification of the integrity may include generating a second CRC from the received frame, comparing the associated CRC to the second CRC and if the associated CRC does not equal the second CRC, indicating an error in data integrity, the frame and CRC are retransmitted by the sender, typically a host computer. In any case of the comparison, the second CRC is discarded after comparison. Buffering may also include storage of the frame and associated CRC in memory, retrieval of the frame and associated CRC from memory and verification of the integrity of the retrieved frame and the associated CRC. The frame and CRC is stored sequentially in a first portion of the memory and the CRC is stored sequentially in a second portion of the memory. Verification of the frame and CRC that was retrieved is similar to verification of receipt from the sender: A third CRC is generated from the frame, which is compared to the retrieved CRC. If the comparison does not equate, an error exists in either the retrieved frame or the CRC, necessitating retrieval of the frame and the associated CRC.

Block 1020 of method 1000 for generating error detection and correction information for data involves generating a master CRC from the plurality of frame CRCs. In block 1030, the frame CRCs are discarded and in block 1040, the frames are assembled into a contiguous buffer of data. In block 1050, a first ECC and a logical buffer address (LBA) is generated for the contiguous buffer and then a final ECC is generated from the first ECC and the LBA, and the master CRC and the final ECC are transmitted to a destination medium, such as magnetic tape, optical tape, magnetic disc, optical disc or memory 1060. Subsequently, the method ends 1070.

Figure 11:
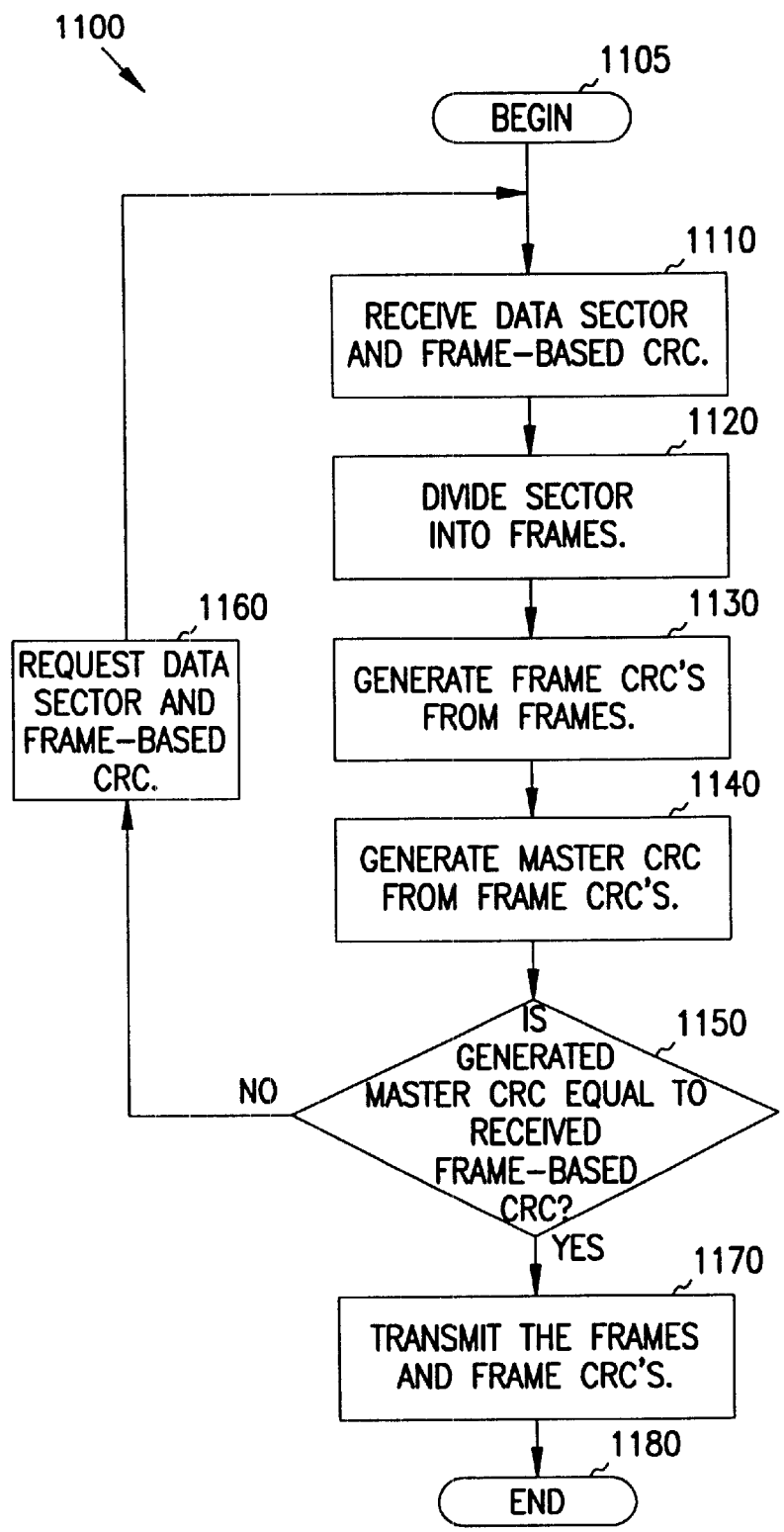
FIG. 11 is a block diagram of a preferred embodiment method of verifying integrity based on a master CRC in the reading of data from a disc.

FIG. 11 is flowchart 1100 of one embodiment of the present invention. The method 1100, for generating error detection and correction information for data which implement the reading of data from the mass-storage, begins 1105. Thereafter, a sector of data and a first master CRC that was yielded in block 1060 of FIG. 10 in block is received from a recorded source medium, such as mass-storage device 1110, wherein the master CRC is determined by first determining one CRC from each of a plurality of frames of the sector and then determining the master CRC from the plurality of frame CRCs. In blocks 1120, 1130, 1140, 1150, 1160, the integrity of the sector and the master CRC is verified. Verification involves logically or physically dividing the sector into a plurality of frames as in block 1120, generating one CRC from each of the plurality of frames as in block 1130, generating a second master CRC from the frame CRCs as in block 1140, comparing the first master CRC to the second master CRC, discarding the generated second CRC as in block 1150, and if the comparison does not indicate equality, then discarding the received sector and the associated master CRC and requesting retransmission from the source as in block 1160.

Finally, block 1170 indicates each frame and it's associated CRC is transmitted to a receiving medium, such as a host computer. Before transmission, each frame is identified from the sector by logically or physically dividing the sector into a plurality of frames. More specifically, transmission also includes buffering the data frames and the frame CRCs which more specifically involves receiving a frame of data and an associated CRC, verifying the integrity of the received frame and the associated CRC, storing the frame and associated CRC in memory, retrieving the frame and associated CRC from memory, verifying the integrity of the retrieved frame and the associated CRC. The storing further comprises storing the frames sequentially in a first portion of the memory and storing the CRCs sequentially in a second portion of the memory. Verification involves generating a CRC from the frame and comparing the generated CRC to the retrieved CRC, where the comparison indicates an error, the frame and CRC are resent. Subsequently, the method ends 1180.

Figure 12:
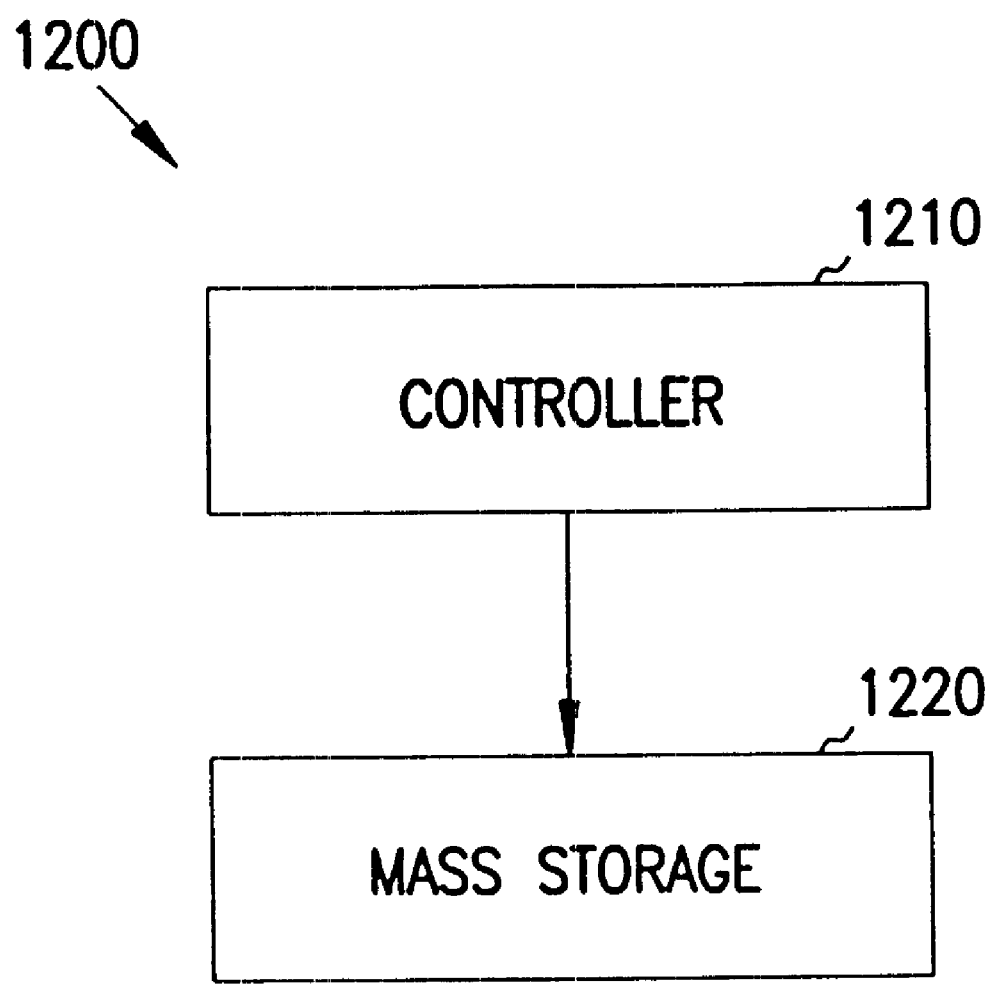
FIG. 12 is a block diagram of a embodiment apparatus for generating a master cyclic redundancy code in the recording of data to a destination medium.

FIG. 12 is a block diagram of an embodiment apparatus 1200 for generating a master cyclic redundancy code in the recording of data to a destination medium. The controller 1210 receives frames of data and a logical block address, generates one LBA-seeded CRC from each of frames, referred to as frames CRCs, and generates a master CRC from the frame CRCs, then assembles the frames into a sector, generates a LBA-seeded ECC from the sector, and transmits the sector, the master-CRC and the ECC to the mass storage device 1220.

Figure 13:
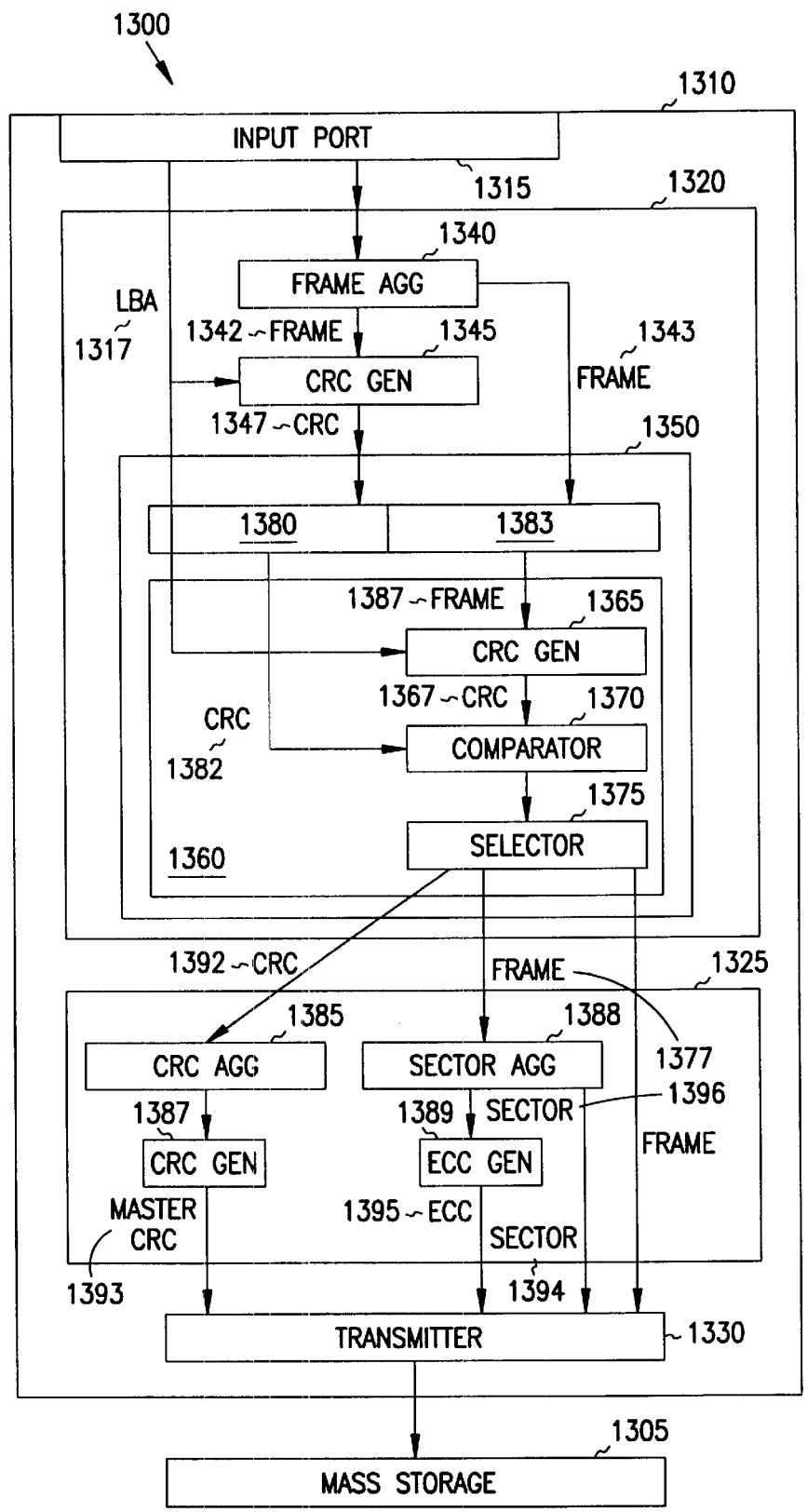
FIG. 13 is a block diagram of a preferred embodiment apparatus for generating a master cyclic redundancy code in the recording of data to a destination medium.

FIG. 13 is a block diagram of a preferred embodiment apparatus 1300 for generating a master cyclic redundancy code in the recording of data to a destination medium. The apparatus 1300 comprises a mass-storage device 1305, and a controller 1310 operatively coupled to the mass-storage device 1305 for receiving through an input port 1315 a plurality of frames, generating a frame cyclic redundancy code from each of the frames, generating a master cyclic redundancy code from the frame cyclic redundancy codes, generating an error correction code from the plurality of frames, discarding the frame cyclic redundancy codes, and transmitting to the mass-storage device the plurality of data frames, the master cyclic redundancy code and the error correction code. The mass-storage device 1305 can also include one or more devices selected from the group consisting of a magnetic disc, an optical disc, and a tape cartridge. The controller 1310 can include a receiver 1320 operatively coupled to the input port 1315 that receives from the input port 1315 the plurality of frames and a logical block address 1317 associated with the frame, and generates a frame cyclic redundancy code from each of the frames, the generating of the frame cyclic redundancy codes being seeded with the logical block address. The controller 1310 can also include a frame-based CRC generator 1325 operatively coupled to the receiver 1320 that receives the plurality of frames and the frame cyclic redundancy codes generated from the plurality of frames, generates a master cyclic redundancy code from the frame cyclic redundancy codes, and aggregates the frames into a sector, and generates an error-correction code from the sector, the generating of the error-correction code being seeded with the logical block address. The controller 1310 can further include 1330 a transmitter operatively coupled between the frame-based CRC generator 1325 and the mass-storage device 1305 that receives the sector, master cyclic redundancy code and error-correction code from the frame-based CRC generator and transmits the sector, the master cyclic redundancy code and the error-correction code to the mass-storage device 1305. The receiver 1320 can include a frame aggregator 1340 operatively coupled to the input port 1315 for receiving a plurality of bytes and aggregating the plurality of bytes into a frame 1342, and 1343. The receiver 1320 can also include a first cyclic redundancy code generator 1345 operatively coupled to the frame aggregator 1340 for receiving the plurality of frames and receiving the logical block address 1317 from the input port 1315, and generating a plurality of frame cyclic redundancy codes 1346 from the frames 1343, wherein one frame cyclic redundancy code is generated from each of the frames, the generating of the frame cyclic redundancy codes being seeded with the logical block address 1317. The receiver 1320 can include a buffer device 1350 operatively coupled to the frame aggregator 1340 and the first cyclic redundancy code generator 1345 that buffers the frames and the cyclic redundancy codes and sends the frames and the cyclic redundancy codes to the frame-based CRC generator 1325. The buffer device 1350 can include a memory device 1355 operatively coupled to the first cyclic redundancy code generator 1345 and the memory device 1355 responsive to: a write command to store the frames 1343 and the first cyclic redundancy codes 1347 in the memory device 1355, and responsive to a read command to retrieve the frame and the first cyclic redundancy code from the memory device 1355. The buffer device 1350 can also include a verifier 1360 operatively coupled between the memory device 1355 and the first frame-based CRC generator 1345 that operates to verify an integrity of a retrieved frame 1383 and a retrieved frame cyclic redundancy code 1382. The verifier 1360 can include a second cyclic redundancy code generator 1365 operatively coupled to the memory device 1355 for generating a second cyclic redundancy code 1367 from the frame, the generating of the cyclic redundancy code being seeded with the logical block address 1317. The verifier 1360 can also include a comparator 1370 operatively coupled to the second cyclic redundancy code generator 1365 and operatively coupled to the memory device 1355 for comparing the first cyclic redundancy code to the second cyclic redundancy code. The verifier 1360 can also include a selector 1375 operatively coupled to the comparator 1370 for discarding the frame, the first cyclic redundancy code and the second cyclic redundancy code and requesting re-retrieval from the memory device 1355 if the comparator 1370 does not indicate equality, and to transmit the sectors, first cyclic redundancy codes and error-correction codes to the frame-based CRC generator 1325 if the comparator 1370 indicates equality. The memory device 1355 can also include a first portion 1380 operatively coupled between the first cyclic redundancy code generator 1345 and the comparator 1370 for storing the cyclic redundancy codes, and a second portion 1383 operatively coupled between the frame aggregator 1340 and the second cyclic redundancy code generator 1365 for storing the frame. The frame-based CRC generator 1325 can include a frame-CRC aggregator 1385 operatively coupled to the receiver 1320 to receive the plurality of frame cyclic redundancy codes 1392, and subsequently aggregate the frame cyclic redundancy codes. The frame-based CRC generator 1325 can also include a third cyclic redundancy code generator 1387 operatively coupled to the frame-CRC aggregator 1385 to generate a master-cyclic redundancy code from the aggregated frame cyclic redundancy codes, and send the master-cyclic redundancy code to the transmitter. The frame-based CRC generator 1325 can also include a sector aggregator 1388 operatively coupled to the receiver to receive frames 1377 from the selector 1375, and later aggregate the frames into sectors and send the sectors to the transmitter 1330. The frame-based CRC generator 1325 can also include an error correction code generator 1389 operatively coupled to the sector aggregator 1388 to generate an error correction code from the sector that is output by the sector aggregator 1388, the generating of the error correction code being seeded with the logical block address, and subsequently send the error-correction code to the transmitter.

Figure 14:
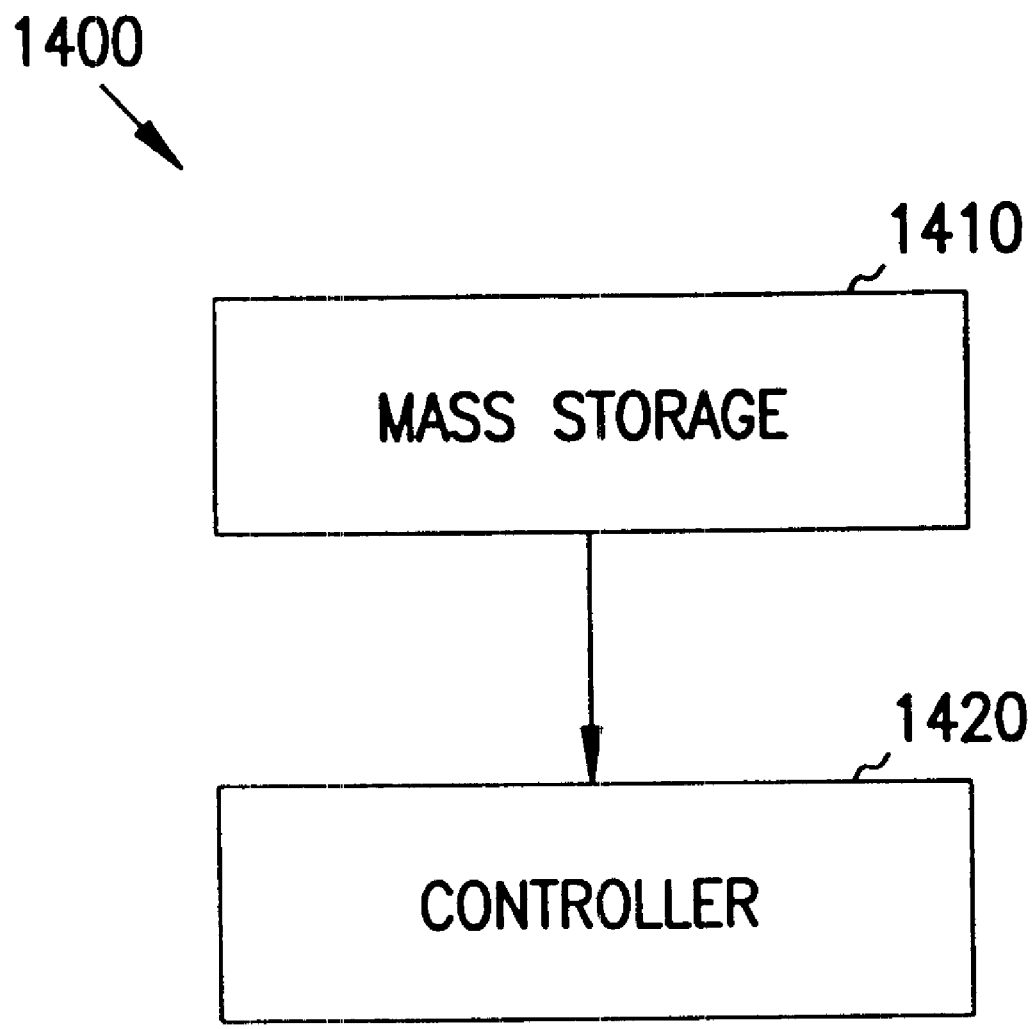
FIG. 14 is a block diagram of a preferred embodiment frame-based CRC apparatus of reading data from a source medium.

FIG. 14 is a block diagram of a preferred embodiment frame-based CRC apparatus 1400 of reading data from a source medium. Mass storage 1410 transmits to the controller 1420 a 512-byte sector of data, a logical block address, a first master CRC, and an ECC. The controller 1420 receives the 512-byte sector of data, the logical block address, the first master CRC, and the ECC outputs a plurality of frames. In one embodiment, the controller 1420 divides the sector into frames, generates LBA-seeded CRCs for each of the frames, generates a second master CRC from the LBA-seeded CRCs, and compares the first master CRC to the second master CRC to determine data integrity.

Figure 15:
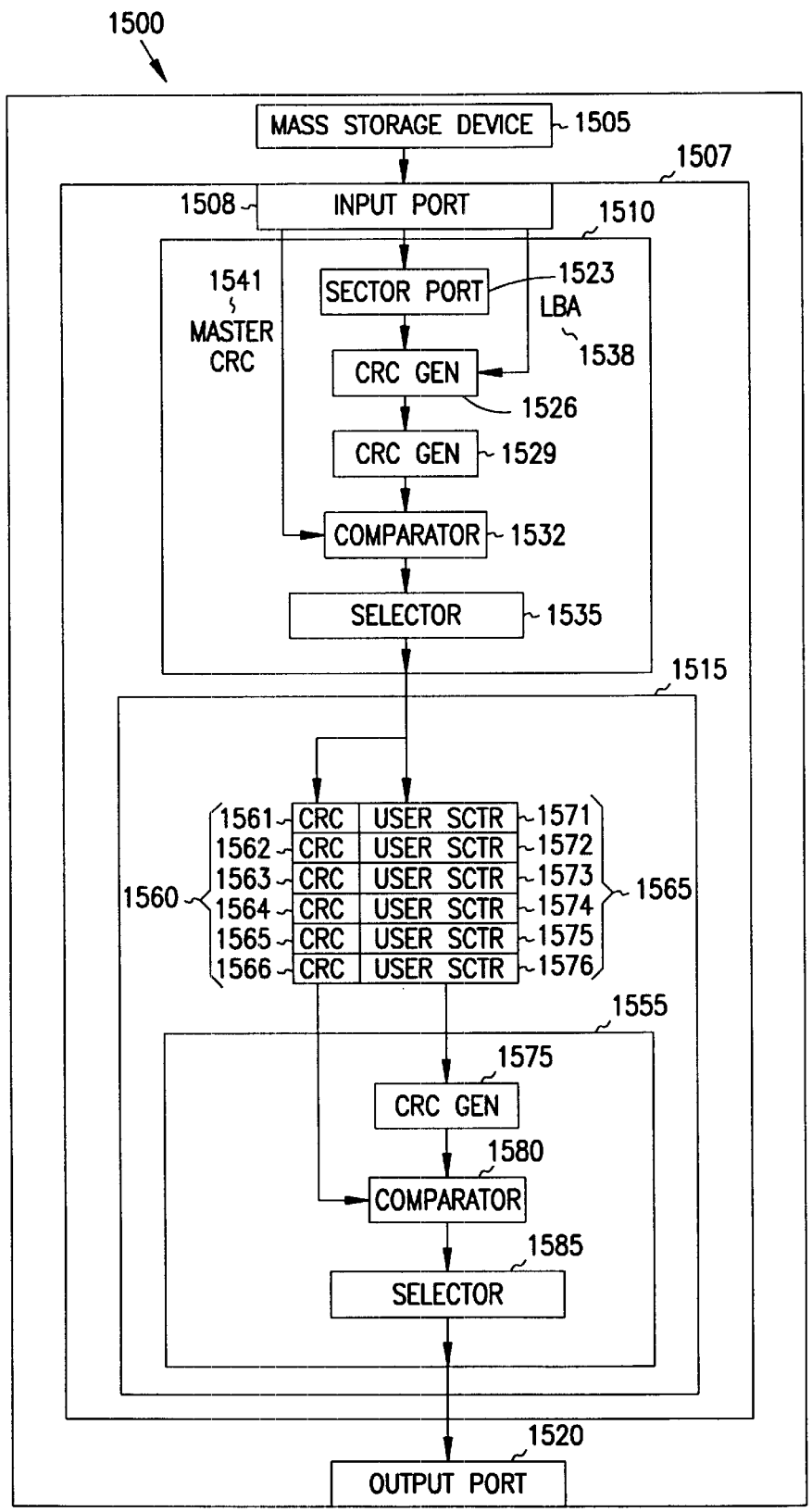
FIG. 15 is a block diagram of a preferred embodiment frame-based CRC apparatus of reading data from a source medium.

FIG. 15 is a block diagram of a preferred embodiment frame-based CRC apparatus of reading data from a source medium. FIG. 15 illustrates several components used in reading from mass storage. A system 1500, like the one shown in FIG. 15 includes a mass storage device 1505 and a controller 1507. The controller 1507 includes an input port 1508, an input verifier 1510, a buffer device 1515, and an output port 1520. The input verifier 1510 includes a sector partitioner 923, a first CRC generator 1526, a second CRC generator 1529, a comparator 1532, and a selector 1540. The input verifier 1510 receives a data sector, a logical block address 1538, and a first master-CRC 1541, all from the mass storage device 905 through the input port 1508. Thereafter, the sector partitioner 1523 partitions the sector into a plurality of frames, a frame being a subset of the entire sector. Subsequently, the first CRC generator 1526 generates one CRC from each of the frames, referred to as a frame-CRC, and each frame CRC being seeded with the logical block address 1538,. Then, a second CRC generator 1529 generators a second master CRC from the plurality of frame-CRCs. The comparator 1532 compares the second master-CRC with the first master-CRC for equality. If the comparison indicates inequality, meaning there is an error in the data integrity, the selector 1535 will attempt correction of the data integrity error. The selector 1535 re-requests the data sector, the logical block address 1538 and first master-CRC 1541 if the attempt at error correction fails. However, the selector 1541 will send the data sector and first master-CRC to the buffer device 1515 if the data error correction attempt was successful or if the comparison shows equality.

The buffer device 1515 includes a memory device 1550 and a buffer verifier 1555. The memory device 1550 includes a first portion 1560 for storing CRCs 1561, 1562, 1563, 1564, 1565, 1566, and a second portion 1565 for storing frames, 1571, 1572, 1573, 1574, 1575, 1576. The frames are stored in the second portion 1565, and the CRCs are stored in the first portion 1560. The buffer verifier 1555 includes a CRC generator 1575, and comparator 1580, and a selector 1585. The buffer verifier 1515 retrieves a CRC and a frame from the memory device 1550. The CRC generator 1575 generates a third CRC from the frame, the frame being seeded with the logical block address, and thereafter, the comparator 1580 compares the third CRC to the retrieved CRC. The selection circuit 1585 will send the frame to the output port if the comparison indicates equality. Otherwise, the selection circuit 1585 will re-retrieve the CRC and data frame from the memory device 1550.

Figure 17:
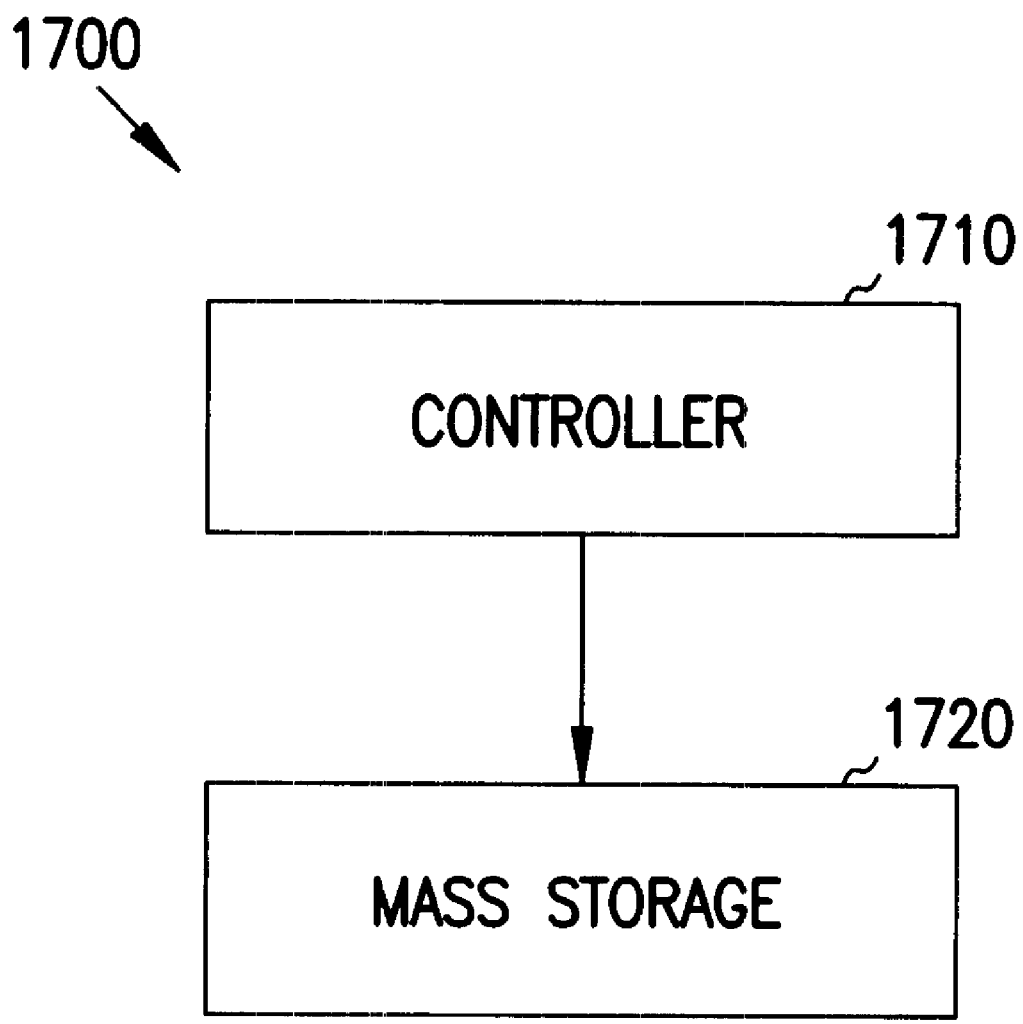
FIG. 17 is a block diagram of a embodiment apparatus for generating an IOEDC in the recording of data to a destination medium.

FIG. 17 is a block diagram of an embodiment apparatus 1700 for generating an IOEDC in the recording of data to a destination medium. The controller 1710 receives frames of data and a logical block address, generates one LBA-seeded IOEDC from each of sectors, and transmits the sector, the IOEDC and the ECC to the mass storage device 1720.

Figure 18:
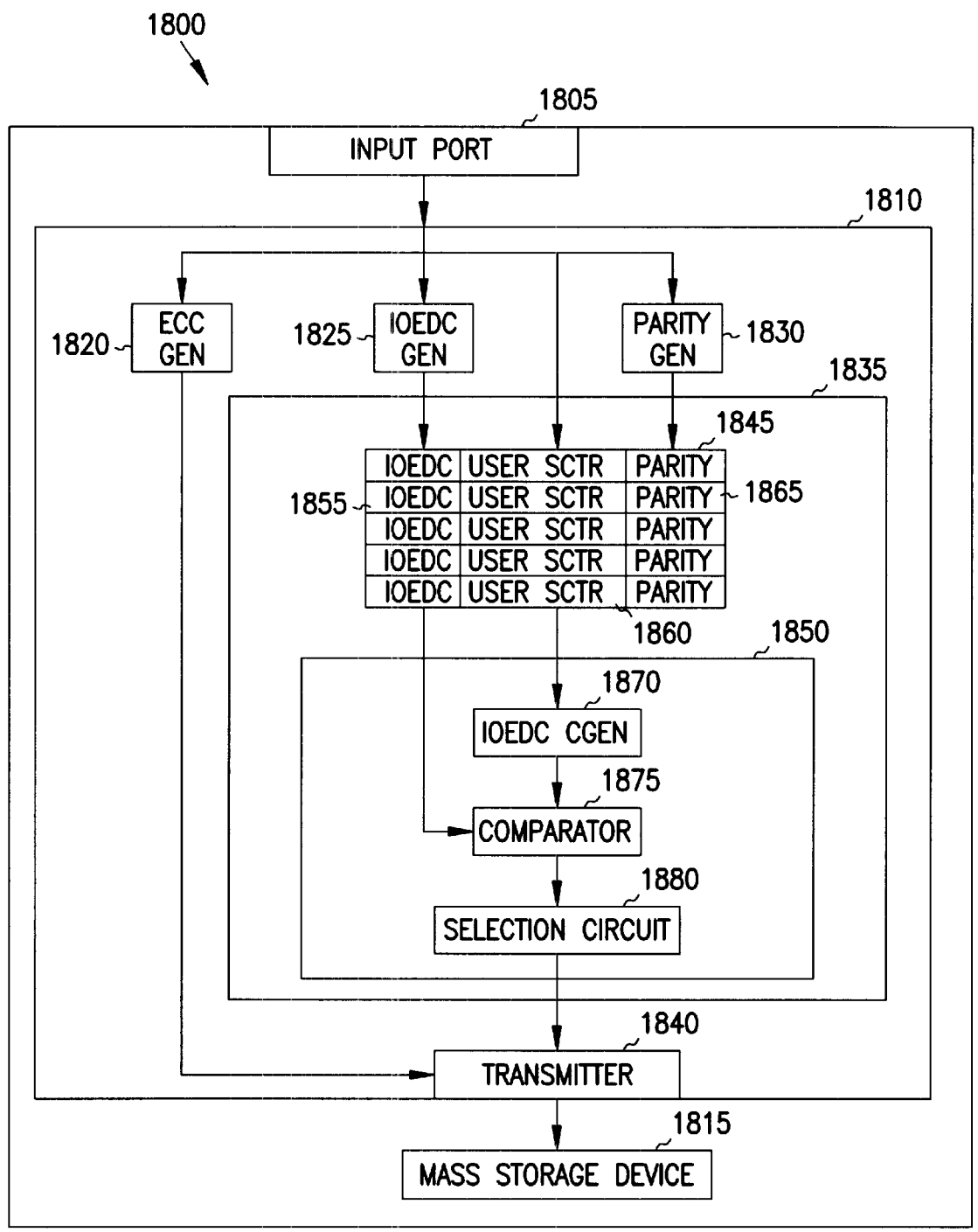
FIG. 18 is a block diagram of a preferred embodiment IOEDC-based apparatus for recording data to a disc.

The present invention is illustrated in FIG. 18. FIG. 18 illustrates several steps in writing to mass storage. The inventive computer system 1800 is shown. A system, like the one shown in FIG. 18 includes an input port 1805, a controller 1810, and mass storage device 1815. The controller 1810 includes and ECC generator 1820, an IOEDC generator 1825, a parity generator 1830, a buffer device 1835, and a transmitter 1840. The buffer device 1835 includes a memory device 1845 and a verifier 1850. The memory device 1845 includes a portion for storing IOEDCs 1855, a portion for storing data sectors 1860, and a portion for storing parities 1865. The verifier includes a second IOEDC generator 1870, a comparator 1875 and a selection circuit 1880.

Figure 19:
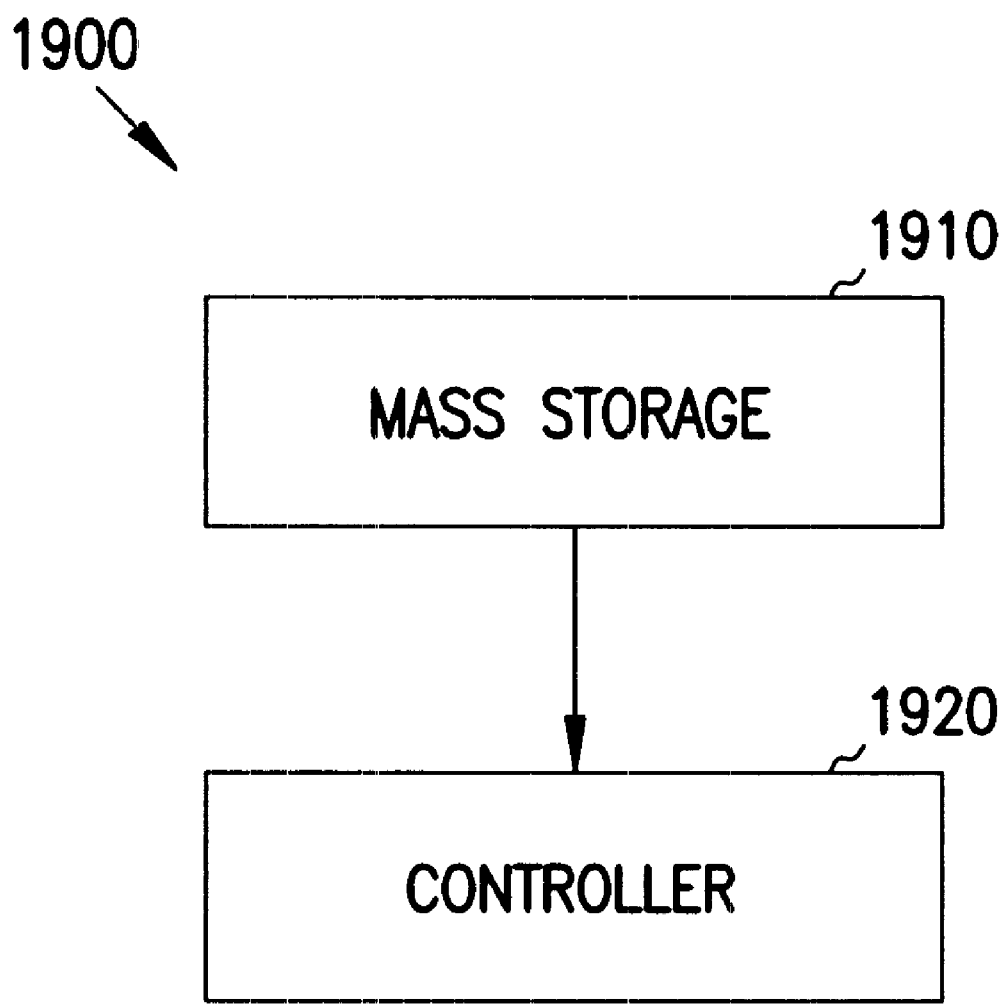
FIG. 19 is a block diagram of a preferred embodiment IOEDC-based apparatus of reading data from a source medium.

FIG. 19 is a block diagram of a preferred embodiment IOEDC-based apparatus 1900 of reading data from a source medium. Mass storage 1910 transmits to the controller 1920 a 512-byte sector of data, a logical block address, a first IOEDC, and an ECC. The controller 1920 receives the 512-byte sector of data, the logical block address, the first IOEDC, and the ECC. In one embodiment, the controller 1920 generates a second LBA-seeded IOEDC from the sector, and compares the first IOEDC to the second IOEDC to determine data integrity.

Figure 20:
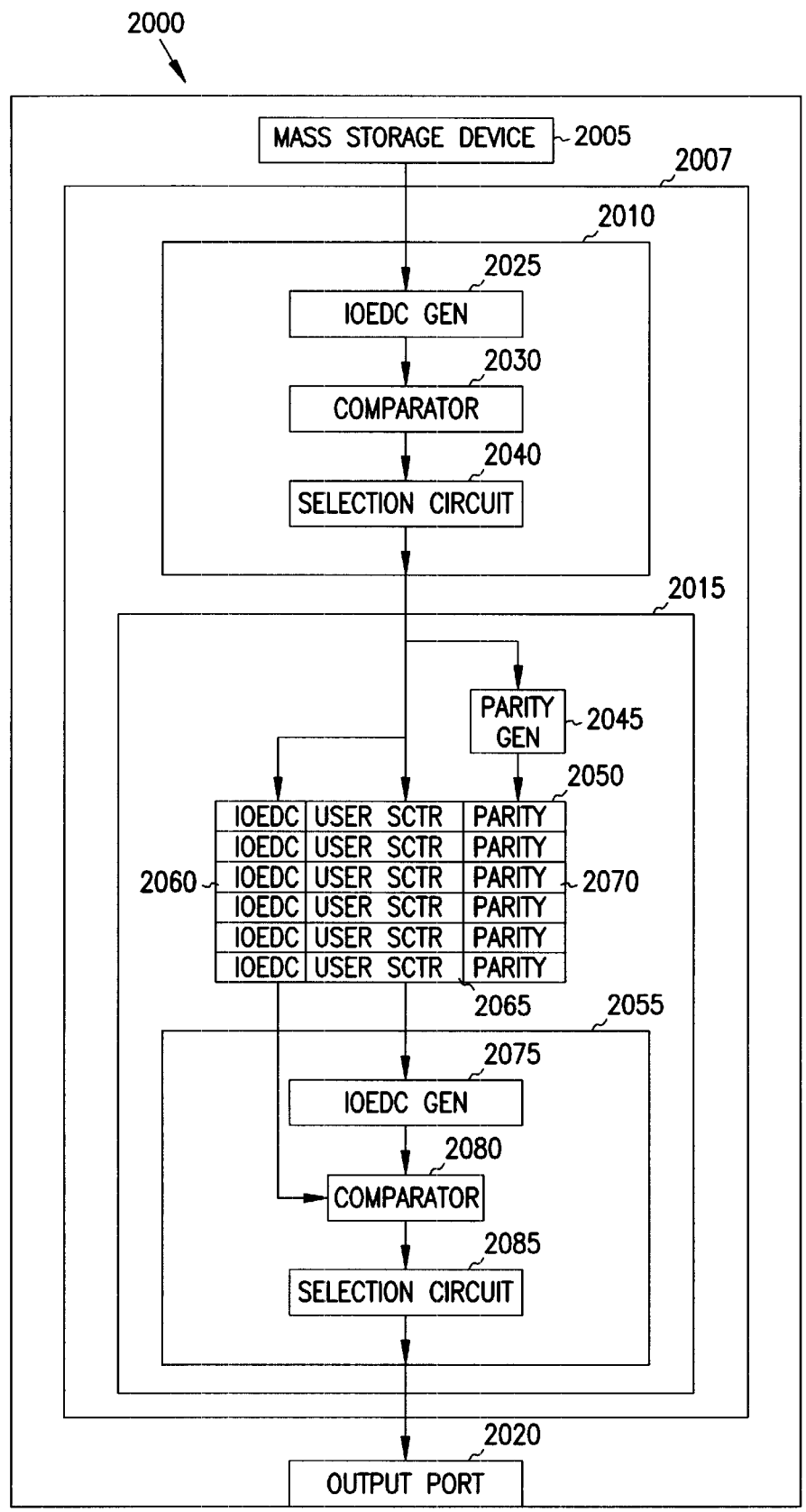
FIG. 20 is a block diagram of a preferred embodiment IOEDC-based apparatus of reading data from a disc.

The present invention is illustrated in FIG. 20. FIG. 20 illustrates several steps in reading from mass storage. The inventive computer system 2000 is shown. A system, like the one shown in FIG. 20 includes a mass storage device 2005 and a controller 2007. The controller 2007 include an input verifier 2010, a buffer device 2015, and an output port 2020. The input verifier 2010 includes an IOEDC generator 2025, and comparator 2030, and a selection circuit 2040. The input verifier 2010 receives a data sector, a logical block address, an ECC seeded with the logical block address, and an IOEDC seeded with the logical block address, all from the mass storage device. Subsequently, the IOEDC generator 2025, generates a second IOEDC seeded with the logical block address and the comparator 2030 compares the IOEDC received from the mass storage to the second IOEDC. The selection circuit 2040 re-requests the data sector, logical block address, IOEDC and ECC if the comparison indicates inequality, however, the selection circuit 2040 will send the data sector and IOEDC to the buffer device if the comparison shows equality. The buffer device 2015 includes a parity generator 2045, a memory device 2050 and a buffer verifier 2055. The memory device 2050 includes a first portion 2060 for storing IOEDCs, a second portion 2065 for storing sector data, and a third portion 2070 for storing parities. The parity generator 2045 will generate a parity for each frame of the sector, seeded with the logical block address, and the data sector is stored in the second portion 2065, the IOEDC is stored in the first portion 2060, and the parity is stored in the third portion 2070. The buffer verifier 2055 includes an IOEDC generator 2075, and comparator 2080, and a selector 2085.

In data transfer types 1 and 3, the buffer verifier 2015 retrieves the IOEDC and data sector from the memory device 2050. The IOEDC generator 2075 generates a third IOEDC from the data sector seeded with the logical block address, and thereafter, the comparator 2080 compares the third IOEDC to the retrieved IOEDC. Subsequently, the selection circuit 2085 will re-retrieve the IOEDC and data sector from the memory device 2050 if the comparison from comparator 2080 indicates inequality, but will send the data sector to the output port if the comparison indicates equality.

In data transfer types 2 and 4, in a conventional process, the buffer verifier 2015 retrieves the parities and data sector from the memory device 2050. The parity generator (not shown) generates a series of third LBA-seeded parities from each of the frames of the data sector, and thereafter, the comparator 2080 compares the third parities to the retrieved IOEDC. Subsequently, the selection circuit 2085 will re-retrieve the parities and data sector from the memory device 2050 if the comparison from comparator 2080 indicates inequality, but will send the data sector to the output port if the comparison indicates equality.

Figure 16:
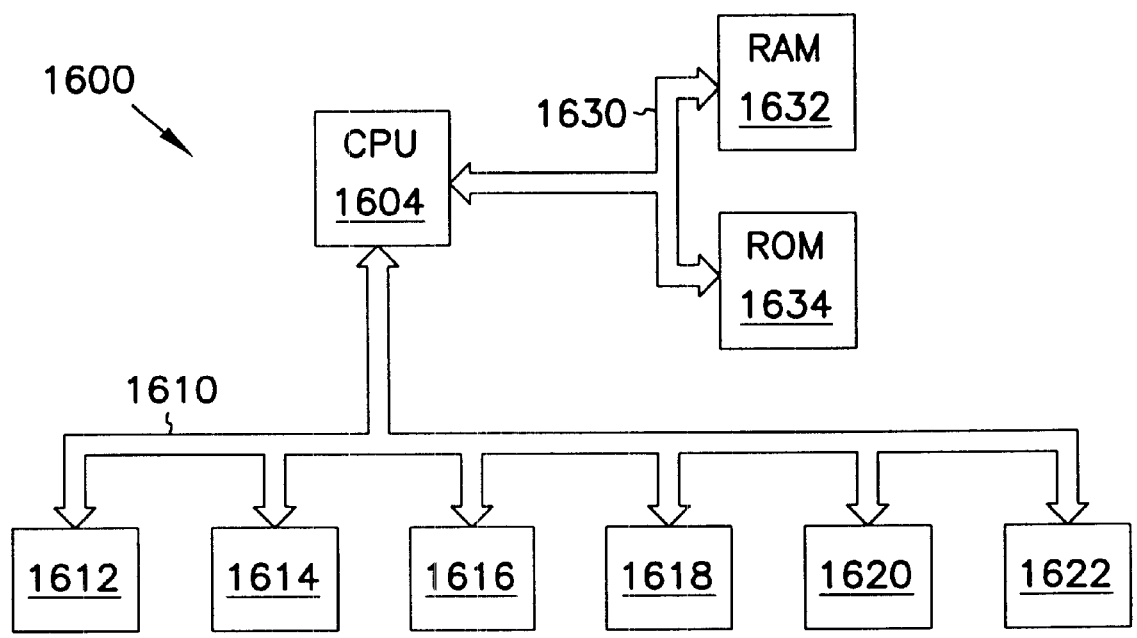
FIG. 16 is a schematic view of a computer system.

FIG. 16 is a schematic view of a computer system. Advantageously, the invention is well-suited for use in a computer system 1600. The computer system 1600 may also be called an electronic system or an information handling system and includes a central processing unit, a memory and a system bus. The information handling system includes a central processing unit 1604, a random access memory 1632, and a system bus 1630 for communicatively coupling the central processing unit 1604 and the random access memory 1632. The information handling system 1602 includes a disc drive device which includes the ramp described above. The information handling system 1602 may also include an input/output bus 1610 and several devices peripheral devices, such as 1612, 1614, 1616, 1618, 1620, and 1622 may be attached to the input output bus 1610. Peripheral devices may include hard disc drives, magneto optical drives, floppy disc drives, monitors, keyboards and other such peripherals. Any type of disc drive may use the method for loading or unloading the slider onto the disc surface as described above.

Advantageously, the invention increases the integrity of data stored on mass-storage, which is achieved through the use of a master CRC that is calculated from each of the frame CRCs. The use of a master CRC yields much greater data integrity than previous methods of error detection and correction.

Advantageously, the invention reduces format overhead on mass-storage device which is achieved through the use of a master CRC. The use of a master CRC yields such a great increase in data integrity that the use of the IOEDC for error detection and correction may be obsolete. IOEDC for error detection and correction is not recorded on disc, contrary to conventional systems, resulting in reduced format overhead and therefore increased efficiency in the use of storage space on the medium.

Advantageously, the invention reduces controller logic complexity. This is achieved by the present invention because IOEDC logic does not need to be implemented on the controller or the portion of the system that manages the mass-storage.

Yet another is that impact on controller design is minimized. The present invention leverages the use of conventional controller logic because conventional controller chips are typically manufactured with logic that will generate a CRC from data. The present invention uses the existing error detection and correction logic for generating CRCs, therefore, no additional logic to support CRC processing is required. Therefore, the use of existing EDAC logic minimizes changes in controller logic to implement the invention.

Conclusion

In conclusion, a method for supporting error detection and correction of data when writing to a mass-storage device is disclosed, in which a plurality of data frames and an equal number of CRCs associated with each of the frames is received 610, and a master CRC is generated from the plurality of frame CRCs 620. The method may also thereafter include discarding the frame CRCs 630, assembling the plurality of data frames into a contiguous buffer of data 640, generating ECC for the contiguous buffer 650 and transmitting the buffer, the master CRC and the ECC to a destination medium 660. The above receiving step may also include buffering the data frames and the frame CRCs and the above buffering step may also include receiving a frame of data and an associated CRC from a source, verifying the integrity of the received frame and the associated CRC, storing the frame and associated CRC in memory, retrieving the frame and associated CRC from memory, verifying the integrity of the retrieved frame and the associated CRC. The first storing step above may also include storing the frames sequentially in a first portion of the memory and storing the CRCs sequentially in a second portion of the memory. The first verifying step above may include generating a second CRC from the received frame, comparing the associated CRC to the second CRC, discarding the received frame and the associated CRC and requesting retransmission from the source if the comparison does not indicate equality. The second verifying step above may include generating a third CRC from the retrieved frame, comparing the associated CRC to the third CRC, and discarding the retrieved frame and the associated CRC and continuing execution at the point where a frame of data and it's associated CRC is received if the comparison does not indicate equality.

Furthermore, a method for supporting error detection and correction of data read from a mass-storage device is disclosed, in which a sector of data and a first master CRC is received from a source medium 710 wherein the master CRC is determined by determining one CRC from each of a plurality of frames of the sector. The method thereafter includes verifying the integrity of the sector and the master CRC. Verification may includes logically or physically dividing the sector into a plurality of frames 720, generating one CRC from each of the plurality of frames 730, generating a second master CRC from the frame CRCs 740, comparing the first master CRC to the second master CRC 750, discarding the received sector and the associated master CRC and requesting retransmission from the source if the comparison does not indicate equality 750. The method may thereafter include logically or physically dividing the sector into a plurality of frames and transmitting each frame and the associated CRC to a receiving medium 770. The transmitting step may also include buffering the data frames and the frame CRCs and the buffering step may also include receiving a frame of data and an associated CRC, verifying the integrity of the received frame and the associated CRC, storing the frame and associated CRC in memory, retrieving the frame and associated CRC from memory, verifying the integrity of the retrieved frame and the associated CRC. The storing step may include storing the frames sequentially in a first portion of the memory and storing the CRCs sequentially in a second portion of the memory and the first verifying step may also include generating a second CRC from the received frame, comparing the associated CRC to the second CRC, discarding the received frame and the associated CRC and requesting retransmission from the source if the comparison does not indicate equality. The second verifying step may also include generating a third CRC from the retrieved frame, comparing the associated CRC to the third CRC, and discarding the retrieved frame and the associated CRC and continuing at with the receiving of data from the mass-storage device if the comparison does not indicate equality.

In addition, an apparatus for generating a master cyclic redundancy code 1300 is disclosed comprising a mass-storage device 1305, and a controller 1310 operatively coupled to the mass-storage device 1305 for receiving through an input port 1315 a plurality of frames, generating a frame cyclic redundancy code from each of the frames, generating a master cyclic redundancy code from the frame cyclic redundancy codes, generating an error correction code from the plurality of frames, discarding the frame cyclic redundancy codes, and transmitting to the mass-storage device the plurality of data frames, the master cyclic redundancy code and the error correction code. The mass-storage device 1305 can also include one or more devices selected from the group consisting of a magnetic disc, an optical disc, and a tape cartridge. The controller 1310 can include a receiver 1320 operatively coupled to the input port 1315 that receives from the input port 1315 the plurality of frames and a logical block address associated with the frame, and generates a frame cyclic redundancy code from each of the frames, the generating of the frame cyclic redundancy codes being seeded with the logical block address. The controller 1310 can also include a frame-based CRC generator 1325 operatively coupled to the receiver 1320 that receives the plurality of frames and the frame cyclic redundancy codes generated from the plurality of frames, generates a master cyclic redundancy code from the frame cyclic redundancy codes, and aggregates the frames into a sector, and generates an error-correction code from the sector, the generating of the error-correction code being seeded with the logical block address. The controller 1310 can further include 1330 a transmitter operatively coupled between the frame-based CRC generator 1325 and the mass-storage device 1305 that receives the sector, master cyclic redundancy code and error-correction code from the frame-based CRC generator and transmits the sector, the master cyclic redundancy code and the error-correction code to the mass-storage device 1305. The receiver 1320 can include a frame aggregator 1340 operatively coupled to the input port 1315 for receiving a plurality of bytes, aggregating the plurality of bytes into a frame, receiving a logical block address. The receiver 1320 can also include a first cyclic redundancy code generator 1345 operatively coupled to the frame aggregator 1340 for receiving the plurality of frames and receiving the logical block address from the input port 1315, and generating a plurality of frame cyclic redundancy codes from the frames, wherein one frame cyclic redundancy code is generated from each of the frames, the generating of the frame cyclic redundancy codes being seeded with the logical block address. The receiver 1320 can include a buffer device 1350 operatively coupled to the frame aggregator 1340 and the first cyclic redundancy code generator 1345 that buffers the frames and the cyclic redundancy codes and sends the frames and the cyclic redundancy codes to the frame-based CRC generator 1325. The buffer device 1350 can include a memory device 1355 operatively coupled to the first cyclic redundancy code generator 1345 and the memory device 1355 responsive to: a write command to store the frames and the first cyclic redundancy codes in the memory device 1355, and responsive to a read command to retrieve the frame and the first cyclic redundancy code from the memory device 1355. The buffer device 1350 can also include a verifier 1360 operatively coupled between the memory device 1355 and the first frame-based CRC generator 1345 that operates to verify an integrity of a retrieved frame and a retrieved frame cyclic redundancy code. The verifier 1360 can include a second cyclic redundancy code generator 1365 operatively coupled to the memory device 1355 for generating a second cyclic redundancy code from the frame, the generating of the cyclic redundancy code being seeded with the logical block address. The verifier 1360 can also include a comparator 1370 operatively coupled to the second cyclic redundancy code generator 1365 and operatively coupled to the memory device 1355 for comparing the first cyclic redundancy code to the second cyclic redundancy code. The verifier 1360 can also include a selector 1375 operatively coupled to the comparator 1370 for discarding the frame, the first cyclic redundancy code and the second cyclic redundancy code and requesting re-retrieval from the memory device 1355 if the comparator 1370 does not indicate equality, and to transmit the sectors, first cyclic redundancy codes and error-correction codes to the frame-based CRC generator 1325 if the comparator 1370 indicates equality. The memory device 1355 can also include a first portion 1380 operatively coupled between the first cyclic redundancy code generator 1345 and the comparator 1370 for storing the cyclic redundancy codes, and a second portion 1383 operatively coupled between the frame aggregator 1340 and the second cyclic redundancy code generator 1365 for storing the frame. The frame-based CRC generator 1325 can include a frame-CRC aggregator 1385 operatively coupled to the receiver 1320 to receive the plurality of frame cyclic redundancy codes, and subsequently aggregate the frame cyclic redundancy codes. The frame-based CRC generator 1325 can also include a third cyclic redundancy code generator 1387 operatively coupled to the frame-CRC aggregator 1385 to generate a master-cyclic redundancy code 1393 from the aggregated frame cyclic redundancy codes, and send the master-cyclic redundancy code 1393 to the transmitter. The frame-based CRC generator 1325 can also include a sector aggregator 1388 operatively coupled to the receiver to receive frames 1377 from the selector 1375, and later aggregate the frames into sectors 1394 and send the sectors to the transmitter 1330. The frame-based CRC generator 1325 can also include an error correction code generator 1389 operatively coupled to the sector aggregator 1388 to generate an error correction code from the sector 1394 that is output by the sector aggregator 1388, the generating of the error correction code 1395 being seeded with the logical block address, and subsequently send the error-correction code 1395 to the transmitter.

Furthermore, an apparatus for working with data protected by a master cyclic redundancy code is disclosed 1400, including a mass-storage device drive 1410 and means for receiving from the mass-storage device a sector of data and a first master cyclic redundancy code wherein the master cyclic redundancy code is generated from a plurality of cyclic redundancy codes generated from a plurality of portions of the sector 1420, operatively coupled to the mass-storage device 1410.

Yet another method for protecting data with an input/output error correction and detection checksum is disclosed, the method comprising the steps of receiving a data sector, a physical block address and a logical block address 605, generating an input/output error detection and correction checksum from the sector 690, the generating of the input/output error detection and correction checksum being seeded with the logical block address, generating a cyclic redundancy code from the sector 690, the generating of the input/output error detection and correction checksum being seeded with the physical block address and generating an error correction code from the sector 690, the generating of the error correction code being seeded with the physical block address.

Notwithstanding the above disclosure, a mass-storage drive 320 that includes an input port 305, a mass-storage device 340 connected to the drive and means for receiving through the input port a plurality of data frames and an equal number of CRCs associated with each of the frames 350, generating a master CRC from the frame CRCs, discarding the frame CRCs, and transmitting to the mass-storage device the plurality of data frames and the master CRC 356 is also disclosed. The mass-storage device may be a magnetic disc, an optical disc, magnetic tape, optical tape or memory, in addition to other conventional mass-storage devices. The means also includes other means for discarding the frame CRCs, assembling the plurality of data frames into a contiguous buffer of data, generating ECC for the contiguous buffer and transmitting data to a receiving medium 356. The transmitted data may include the buffer 385, the master CRC 399 and the ECC 377. The receiving means may include means for buffering the data frames and the frame CRCs 330. The buffering means may include means for receiving a frame of data and an associated CRC from a source, first means for verifying the integrity of the frame and the associated CRC, means for storing the frame and associated CRC in memory 350, means for retrieving the frame and associated CRC 353 from memory, and a second means for verifying the integrity of the frame and the associated CRC. The storing means may include means for storing the frames sequentially in a first portion of the memory 350 and means for storing the CRCs sequentially in a second portion of the memory 353 and wherein the first means for verifying step further comprises means for generating a second CRC 390 from the frame, means for comparing the associated CRC to the second CRC, means for discarding the frame and associated CRC and requesting retransmission from the source 310 if the means for comparing does not indicate equality.

Furthermore, a method for generating error detection and correction information for data is disclosed the method comprising steps of receiving at least one data sector and at least one associated physical block address 610, generating an input/output error detection and correction checksum (IOEDC) from the at least one sector 620, generating a cyclic redundancy code seeded with the physical block address from the at least one sector 690, generating an error correction code seeded with the physical block address from the at least one sector 690.

Lastly, a mass-storage drive is disclosed that includes an input port 405, a mass-storage device 340 connected to the drive, and means for receiving 450 from the mass-storage device a sector of data and a first master CRC wherein the master CRC is determined by determining one CRC 460 from each of a plurality of frames of the sector and determining the master CRC from the plurality of frame CRCs and means for verifying the integrity of the sector and the master CRC 450.

An information handling system 1600 is also disclosed, which includes a sender 1604, a receiver operatively coupled to sender, such as 1612, 1614, 1616, 1618, 1620, and 1622, and means for receiving 1210 from the sender a plurality of data frames and an equal number of cyclic redundancy codes associated with each of the frames and generating a master cyclic redundancy code from the frame cyclic redundancy codes.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the disc controller while maintaining substantially the same functionality without departing from the scope and spirit of the present invention. In addition, although the preferred embodiment described herein is directed to a controller for a disc drive system, it will be appreciated by those skilled in the art that the teachings of the present invention can be applied to other systems, like management means systems for disc drive systems or tape drive systems, without departing from the scope and spirit of the present invention.

What is claimed is:

1. A method for generating a master cyclic redundancy code, the method comprising steps of:
   (a) receiving a plurality of data frames and an equal number of frame cyclic redundancy codes associated with each of the frames;
   (b) generating a master cyclic redundancy code from the plurality of frame cyclic redundancy codes;
   (c) discarding the frame cyclic redundancy codes;
   (d) assembling the plurality of data frames into a contiguous buffer of data;
   (e) generating error correction code for the contiguous buffer; and
   (f) transmitting the buffer, the master cyclic redundancy code and the error correction code to a destination medium.

2. The method of claim 1 wherein: the receiving step (a) includes:
   (a)(i) receiving a plurality of bytes;
   (a)(ii) aggregating the plurality of bytes into a frame;
   (a)(iii) generating a first cyclic redundancy code from the frame; and
   (a)(iv) buffering the data frame and the first cyclic redundancy code; and the buffering step (a)(iv) includes:
      (a)(iv)(1) storing the frame and the first cyclic redundancy code in memory;
      (a)(iv)(2) retrieving the frame and the first cyclic redundancy code from memory; and
      (a)(iv)(3) verifying the integrity of the retrieved frame and the retrieved first cyclic redundancy code.

3. The method of claim 2 wherein:
   the storing step (a)(iv)(1) includes storing the frames sequentially in a first portion of the memory, and storing the cyclic redundancy codes sequentially in a second portion of the memory; and
   the verifying step (a)(iv)(3) includes generating a third cyclic redundancy code from the retrieved frame, comparing the first cyclic redundancy code to the third cyclic redundancy code, and discarding the retrieved frame and the first cyclic redundancy code and continuing at the retrieving step (a)(iv)(2) if the comparison does not indicate equality.

4. A method for verifying integrity based on a master cyclic redundancy code, the method comprising steps of:
   (a) receiving from a source medium a sector of data, a logical block address of the sector, and a first master cyclic redundancy code, wherein the first master cyclic redundancy code is generated by:
      (1) receiving a plurality of data frames of the sector and an equal number of frame cyclic redundancy codes associated with each of the frames of the sector;

(2) generating the first master cyclic redundancy code from the plurality of frame cyclic redundancy codes;

(3) discarding the frame cyclic redundancy codes;

(4) assembling the plurality of data frames into a contiguous buffer of data;

(5) generating error correction code for the contiguous buffer; and (6) transmitting the contiguous buffer, the first master cyclic redundancy code and the error correction code to the source medium; and (b) verifying the integrity of the sector and the first master cyclic redundancy code.

5. The method of claim 4 wherein the verifying step (b) includes:

(b)(i) dividing the sector into a plurality of frames;

(b)(ii) generating one cyclic redundancy code from each of the plurality of frames;

(b)(iii) generating a second master cyclic redundancy code from the frame cyclic redundancy codes;

(b)(iv) comparing the first master cyclic redundancy code to the second master cyclic redundancy code; and (b)(v) discarding the received sector and the first master cyclic redundancy code and requesting retransmission from the source medium, if the comparison in step (b)(iv) does not indicate equality.

6. The method of claim 4 further comprising steps of:

(c) dividing the sector into a plurality of frames; and (d) transmitting the plurality of frames to a receiving medium.

7. The method of claim 6 wherein the transmitting step includes buffering the data frames and a plurality of cyclic redundancy codes generated from the plurality of frames and the buffering including steps of:

(d)(i) storing a frame and a cyclic redundancy code in memory;

(d)(ii) retrieving the frame and the cyclic redundancy code from memory; and (d)(iii) verifying the integrity of the retrieved frame and the retrieved cyclic redundancy code.

8. The method of claim 7 wherein:

the storing step (d)(i) includes storing the frame sequentially in a first portion of the memory, and storing the cyclic redundancy code sequentially in a second portion of the memory;

the verifying step (d)(iii) includes generating a second cyclic redundancy code from the retrieved frame, comparing the first cyclic redundancy code to the second cyclic redundancy code, and discarding the retrieved frame and the first cyclic redundancy code and the first cyclic redundancy code continuing at the retrieving step (d)(ii) if the comparison does not indicate equality.

9. An apparatus for generating a master cyclic redundancy code comprising:

a mass-storage device; and a controller operatively coupled to the mass-storage for receiving through an input port a plurality of frames, generating a frame cyclic redundancy code from each of the frames, generating a master cyclic redundancy code from the frame cyclic redundancy codes, generating an error correction code from the plurality of frames, discarding the frame cyclic redundancy codes, and transmitting to the mass-storage device the plurality of data frames, the master cyclic redundancy code and the error correction code.

10. The apparatus of claim 9 wherein the mass-storage device includes one or more devices selected from the group consisting of a magnetic disc, an optical disc, and a tape cartridge.

11. The apparatus of claim 9 in which the controller comprises:

a receiver, operatively coupled to the input port, that receives from the input port the plurality of frames and a logical block address associated with the frames, and generates a frame cyclic redundancy code from each of the frames, the generating of the frame cyclic redundancy codes being seeded with the logical block address;

a frame-based CRC generator operatively coupled to the receiver that receives the plurality of frames and the frame cyclic redundancy codes generated from the plurality of frames, generates a master cyclic redundancy code from the frame cyclic redundancy codes, and aggregates the frames into a sector, and generates an error-correction code from the sector, the generating of the error-correction code being seeded with the logical block address; and a transmitter operatively coupled between the frame-based CRC generator and the mass-storage device that receives the sector, master cyclic redundancy code and error-correction code from the frame-based CRC generator and transmits the sector, the master cyclic redundancy code and the error-correction code to the mass-storage device.

12. The apparatus of claim 11 in which the receiver includes:

a frame aggregator operatively coupled to the input port for receiving a plurality of bytes, aggregating the plurality of bytes into a frame;

a first cyclic redundancy code generator operatively coupled to the frame aggregator for receiving the plurality of frames and operatively coupled to the input port for receiving a logical block address, and generating a plurality of frame cyclic redundancy codes from the frames, wherein one frame cyclic redundancy code is generated from each of the frames, the generating of the frame cyclic redundancy codes being seeded with the logical block address; and a buffer device operatively coupled to the frame aggregator and operatively coupled to the first cyclic redundancy code generator that buffers the frames and the cyclic redundancy codes and sends the frames and the cyclic redundancy codes to the frame-based CRC generator.

13. The apparatus of claim 12 wherein the buffer device includes:

a memory device operatively coupled to the first cyclic redundancy code generator and the memory device responsive to: a write command to store the frames and the first cyclic redundancy codes in the memory device, and responsive to a read command to retrieve the frame and the first cyclic redundancy code from the memory device; and a verifier operatively coupled between the memory device and the first frame-based CRC generator that operates to verify an integrity of a retrieved frame and a retrieved frame cyclic redundancy code wherein the verifier includes:

a second cyclic redundancy code generator operatively coupled to the memory device for generating a second cyclic redundancy code from the frame, the generating of the cyclic redundancy code being seeded with the logical block address;

a comparator operatively coupled to the second cyclic redundancy code generator and operatively coupled to the memory device for comparing the first cyclic redundancy code to the second cyclic redundancy code; and a selector operatively coupled to the comparator for discarding the frame, the first cyclic redundancy code and the second cyclic redundancy code and requesting re-retrieval from the memory device if the comparator does not indicate equality and for transmitting the sector, first cyclic redundancy code and error-correction code to the frame-based CRC generator if the comparator indicates equality.

14. The apparatus of claim 13 wherein the memory device includes:

a first portion operatively coupled between the first cyclic redundancy code generator and the comparator for storing the cyclic redundancy code; and a second portion operatively coupled between the frame aggregator and the second cyclic redundancy code generator for storing the frame.

15. The apparatus of claim 11 wherein the frame-based CRC generator includes:

a frame-CRC aggregator operatively coupled to the receiver to receive the plurality of frame cyclic redundancy codes, and aggregate the frame cyclic redundancy codes;

a third cyclic redundancy code generator operatively coupled to the frame-CRC aggregator to receive the frame cyclic redundancy codes and generate a master-cyclic redundancy code from the frame cyclic redundancy codes, and send the master-cyclic redundancy code to the transmitter;

a sector aggregator operatively coupled to the receiver to receive frames from the receiver, and aggregate the frames into a sector, and send the sector to the transmitter; and a error correction code generator to operatively coupled to the sector aggregator to generate an error correction code from the sector, the generating of the error correction code being seeded with the logical block address, and send the error-correction code to the transmitter.

16. A method of protecting data with an input/output error correction and detection checksum, the method comprising steps of:

(a) receiving a data sector, a physical block address and a logical block address;

(b) generating an input/output error detection and correction checksum from the sector, the generating of the input/output error detection and correction checksum being seeded with the logical block address;

(c) generating a cyclic redundancy code from the sector, the generating of the cyclic redundancy code being seeded with the physical block address; and (d) generating an error correction code from the sector, the generating of the error correction code being seed with the physical block address.

* * * * *